United States Patent
Takagi et al.

(10) Patent No.: US 8,659,130 B2
(45) Date of Patent: Feb. 25, 2014

(54) POWER MODULE AND POWER MODULE MANUFACTURING METHOD

(75) Inventors: Yusuke Takagi, Hitachinaka (JP); Kaoru Uchiyama, Hitachiomiya (JP); Tokihito Suwa, Hitachinaka (JP); Kinya Nakatsu, Hitachinaka (JP); Takeshi Tokuyama, Hitachi (JP); Shinji Hiramitsu, Kashiwa (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/640,512

(22) PCT Filed: Apr. 26, 2011

(86) PCT No.: PCT/JP2011/060165
§ 371 (c)(1),
(2), (4) Date: Nov. 30, 2012

(87) PCT Pub. No.: WO2011/136222
PCT Pub. Date: Nov. 3, 2011

(65) Prior Publication Data
US 2013/0062751 A1 Mar. 14, 2013

(30) Foreign Application Priority Data
Apr. 26, 2010 (JP) .................................. 2010-100468

(51) Int. Cl.
*H01L 23/62* (2006.01)
(52) U.S. Cl.
USPC ........... 257/675; 257/713; 257/714; 257/717; 257/718; 257/719; 257/707; 257/726; 257/727; 438/122

(58) Field of Classification Search
None
See application file for complete search history.

(56) References Cited

U.S. PATENT DOCUMENTS 7,242,582 B2 * 7/2007 Kurauchi et al. ............. 361/704
7,812,443 B2 * 10/2010 Tokuyama et al. ........... 257/706
(Continued)

FOREIGN PATENT DOCUMENTS

JP 2005-175163 A 6/2005
JP 2007-53295 A 3/2007
(Continued)

OTHER PUBLICATIONS

International Search Report with English translation dated Aug. 9, 2011 (two (2) pages).

*Primary Examiner* — David E Graybill
(74) *Attorney, Agent, or Firm* — Crowell & Moring LLP

(57) ABSTRACT

A power module includes: a sealing body including a semiconductor element having a plurality of electrode surfaces, a first conductor plate connected to one electrode surface of the semiconductor element via solder, and a sealing material for sealing the semiconductor element and the first conductor plate, the sealing body having at least a first surface and a second surface on the opposite side of the first surface; and a case for housing the sealing body. The case is configured by a first heat radiation plate opposed to the first surface of the sealing body, a second heat radiation plate opposed to the second surface of the sealing body, and an intermediate member that connects the first heat radiation plate and the second heat radiation plate. The intermediate member has a first thin section having thickness smaller than the thickness of the first heat radiation plate, more easily elastically deformed than the first heat radiation plate, and formed to surround the first heat radiation plate. The sealing body is pressed against and fixed to the second heat radiation plate via the first heat radiation plate by elastic force generated in the first thin section.

13 Claims, 30 Drawing Sheets

(56) References Cited

U.S. PATENT DOCUMENTS

| | | | |
|---|---|---|---|
| 7,961,472 B2 * | 6/2011 | Tokuyama et al. | 361/718 |
| 7,978,471 B2 * | 7/2011 | Tokuyama et al. | 361/699 |
| D651,170 S * | 12/2011 | Yura et al. | D13/110 |
| 8,081,472 B2 * | 12/2011 | Tokuyama et al. | 361/716 |
| D651,565 S * | 1/2012 | Yura et al. | D13/110 |
| 2004/0089940 A1 * | 5/2004 | Mamitsu et al. | 257/718 |
| 2005/0230816 A1 * | 10/2005 | Kurauchi et al. | 257/706 |
| 2007/0096278 A1 * | 5/2007 | Nakatsu et al. | 257/678 |
| 2008/0186751 A1 * | 8/2008 | Tokuyama et al. | 363/131 |
| 2008/0251909 A1 * | 10/2008 | Tokuyama et al. | 257/706 |
| 2009/0302444 A1 * | 12/2009 | Ueda et al. | 257/675 |
| 2010/0038758 A1 * | 2/2010 | Stolze | 257/675 |
| 2011/0249421 A1 * | 10/2011 | Matsuo et al. | 361/821 |
| 2011/0299265 A1 * | 12/2011 | Nakatsu et al. | 361/820 |
| 2011/0310585 A1 * | 12/2011 | Suwa et al. | 361/820 |
| 2012/0087095 A1 * | 4/2012 | Tokuyama et al. | 361/721 |
| 2013/0175678 A1 * | 7/2013 | Ide et al. | 257/675 |

FOREIGN PATENT DOCUMENTS

| | | |
|---|---|---|
| JP | 2008-166333 A | 7/2008 |
| JP | 2008-193867 A | 8/2008 |

* cited by examiner

POWER MODULE AND POWER MODULE MANUFACTURING METHOD

TECHNICAL FIELD

The present invention relates to a power module used in a power converting device and, more particularly, to a power module mounted on a hybrid automobile and an electric automobile and a power module manufacturing method.

BACKGROUND ART

A semiconductor chip for a high withstanding voltage and a large current generates high heat during use. Therefore, a configuration for improving heat radiation properties from the chip is necessary. As an example of the configuration, a configuration in which a pair of heat radiation plates are attached on both sides of a chip is devised. With the configuration, heat radiation properties are improved because heat can be radiated from both the sides of the chip. A semiconductor device of the both-side heat radiation type is entirely molded with resin (PTL 1).

When the molded semiconductor device is housed in a case and mounted on a power converting device, improvement of productivity and further improvement of reliability of connection of terminals, a reduction in size, and the heat radiation properties are demanded.

CITATION LIST

Patent Literature

PTL 1: JP-A-2007-53295

SUMMARY OF INVENTION

Problems to be Solved by the Invention

A problem to be solved by the invention is to improve productivity in housing a resin-molded semiconductor device in a case.

Another problem to be solved by the invention is to improve reliability of connection of terminals of the resin-molded semiconductor device housed in the case.

Still another problem to be solved by the invention is to improve a reduction in size and heat radiation properties of the resin-molded semiconductor device housed in the case.

Means for Solving the Problems

According to a first aspect of the present invention, there is provided a power module including: a sealing body including a semiconductor element having a plurality of electrode surfaces, a first conductor plate connected to one electrode surface of the semiconductor element via solder, and a sealing material for sealing the semiconductor element and the first conductor plate, the sealing body having at least a first surface and a second surface on the opposite side of the first surface; and a case for housing the sealing body, wherein the case is configured by a first heat radiation plate opposed to the first surface of the sealing body, a second heat radiation plate opposed to the second surface of the sealing body, and an intermediate member that connects the first heat radiation plate and the second heat radiation plate, the intermediate member has a first thin section having thickness smaller than the thickness of the first heat radiation plate, more easily elastically deformed than the first heat radiation plate, and formed to surround the first heat radiation plate, and the sealing body is pressed against and fixed to the second heat radiation plate via the first heat radiation plate by elastic force generated in the first thin section.

According to a second aspect of the present invention, in the power module according to the first aspect, it is desirable that a surface of the first heat radiation plate opposed to the first surface of the sealing body is formed to be flush with a surface of the first thin section on an inner side of the case.

According to a third aspect of the present invention, in the power module according to the first aspect, it is desirable that pin fins are formed on the first heat radiation plate and the second heat radiation plate.

According to a fourth aspect of the present invention, in the power module according to the first aspect, it is desirable that linear fins are formed on the first heat radiation plate and the second heat radiation plate.

According to a fifth aspect of the present invention, in the power module according to the first aspect, it is desirable that the intermediate member has a second thin section having thickness smaller than the thickness of the second heat radiation plate, more easily elastically deformed than the second heat radiation plate, and formed to surround the second heat radiation plate, and the sealing body is pressed against the second heat radiation plate via the first heat radiation plate by elastic force generated in the first thin section and pressed against and fixed to the second heat radiation plate via the second heat radiation plate by elastic force generated in the second thin section.

According to a sixth aspect of the present invention, in the power module according to the first aspect, it is desirable that a holding section is formed in the intermediate member, the holding section having thickness larger than the thickness of the first thin section, formed to surround the second heat radiation plate, and having rigidity for preventing the holding section from being deformed even if the holding section receives elastic force of the first thin section generated via the first heat radiation plate and the sealing body.

According to a seventh aspect of the present invention, in the power module according to the sixth aspect, it is desirable that a first protruding section set in contact with a side of the sealing body is formed on the inner wall of the case on a side where the second heat radiation plate is arranged.

According to an eighth aspect of the present invention, in the power module according to the first aspect, it is desirable that the sealing body includes a second conductor plate connected to the other electrode surface of the semiconductor element via solder, a first concave section in which the first conductor plate is exposed in the bottom is formed on the first surface of the sealing body and a second concave section in which the second conductor plate is exposed in the bottom is formed on the second surface of the sealing body, and the first heat radiation plate is fit in the first concave section and the second heat radiation plate is fit in the second concave section.

According to a ninth aspect of the present invention, in the power module according to the eighth aspect, it is desirable that the power module includes a first insulating sheet opposed to an exposed surface of the first conductor plate and stored in the first concave section and a second insulating sheet opposed to an exposed surface of the second conductor plate and stored in the second concave section.

According to a tenth aspect of the present invention, in the power module according to the eighth aspect, it is desirable that an opening section for inserting the sealing body is formed in the case, and, when projected from a direction perpendicular to the electrode surfaces of the semiconductor element, the first concave section is formed such that the length of a first side of a projected portion of the first concave section on a side close to the opening section of the case is larger than the length of the second side opposed to the first side, and the first heat radiation plate is formed such that a projected portion of the first heat radiation plate overlaps a projected section of the first concave section.

According to an eleventh aspect of the present invention, in the power module according to the tenth aspect, it is desirable that the first heat radiation plate is formed such that the length of a first side of the projected portion of the first heat radiation plate on a side close to the opening section of the case is larger than the length of a second side opposed to the first side.

According to a twelfth aspect of the present invention, there is provided a manufacturing method for a power module including: a sealing body including a semiconductor element, a conductor plate connected to an electrode surface of the semiconductor element via solder, and a sealing material for sealing the semiconductor element and the conductor plate, the sealing body having at least a first surface and a second surface on the opposite side of the first surface; and a case including a first heat radiation plate opposed to the first surface of the sealing body, a second heat radiation plate opposed to the second surface of the sealing body, and an intermediate member that connects the first heat radiation plate and the second heat radiation plate and in which an opening for inserting the sealing body is formed, the manufacturing method including: a first step of elastically deforming, when the distance between an opposed surface of the first heat radiation plate and an opposed surface of the second heat radiation plate is defined as D and the thickness of the sealing body is defined as T, a part of the intermediate member of the case such that, in the case formed to have the D smaller than the T, the D changes to D1 larger than the T; a second step of inserting the sealing body from the opening of the case; and a third step of releasing pressurizing force for elastically deforming the part of the intermediate member in the first step such that the D approaches the T from the D1.

According to a thirteenth aspect of the present invention, there is provided a manufacturing method for a power module including: a sealing body including a semiconductor element, a conductor plate connected to an electrode surface of the semiconductor element via solder, and a sealing material for sealing the semiconductor element and the conductor plate, the sealing body having a first concave section formed on one surface and a second concave section formed on the other surface on the opposite side of the one surface, the sealing body having at least a first surface and a second surface on the opposite side of the first surface; and a case including a first heat radiation plate opposed to the first surface of the sealing body and fit in the first concave section, a second heat radiation plate opposed to the second surface of the sealing body and fit in the second concave section, and an intermediate member that connects the first heat radiation plate and the second heat radiation plate and in which an opening for inserting the sealing body is formed, the manufacturing method including: a first step of elastically deforming, when the distance between an opposed surface of the first heat radiation plate and an opposed surface of the second heat radiation plate is defined as D, the distance between the bottom of the first concave section and the bottom of the second concave section of the sealing body is defined as T1, and the thickness of the sealing body is defined as T2, a part of the intermediate member of the case with pressing force of the sealing body inserted from the opening of the case such that, in the case formed to have the D smaller than the T1, the D changes to D1 larger than the T2; and a second step of fitting the first heat radiation plate in the first concave section of the sealing body and fitting the second heat radiation plate in the second concave section of the sealing body.

Effects of the Invention

According to the present invention, it is possible to realize further improvement of productivity of the power module.

BEST MODE FOR CARRYING OUT THE INVENTION

Modes for caring out the present invention are explained below with reference to the drawings.

Figure 1:
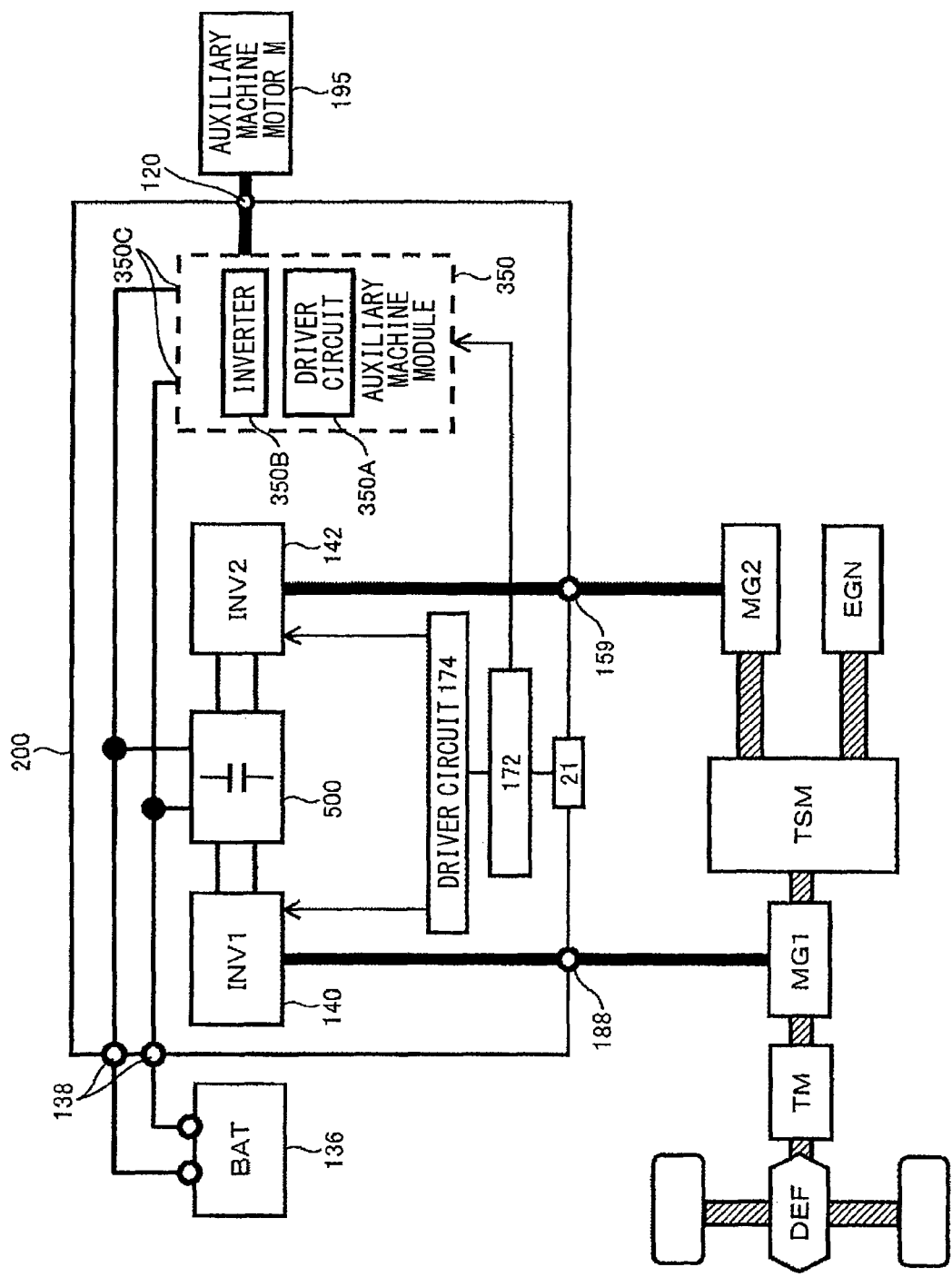
FIG. 1 is a diagram showing a control block of a hybrid automobile.

FIG. 1 is a diagram showing a control block of a hybrid automobile (hereinafter referred to as "HEV"). An engine EGN and a motor generator MG1 and a motor generator MG2 generate torque for traveling of the vehicle. The motor generator MG1 and the motor generator MG2 have a function of not only generating rotation torque but also converting mechanical energy applied to the motor generator MG1 or the motor generator MG2 from the outside into electric power.

The motor generator MG1 or MG2 is, for example, a synchronous machine or an induction machine. As explained above, the motor generator MG1 or MG2 operates as both a motor and a generator according to an operation method. When the motor generator MG1 or MG2 is mounted on an automobile, it is desirable to obtain high power with a small size. A synchronous motor of a permanent magnet type in which a magnet of neodymium or the like is used is suitable. In the synchronous motor of the permanent magnet type, heat generation of a rotor is small compared with an induction motor. The synchronous motor of the permanent magnet type is excellent as a motor for automobile in this viewpoint as well.

Output torque of an output side of the engine EGN and the motor generator MG2 is transmitted to the motor generator MG1 via a power distributing mechanism TSM. Rotation torque from the power distribution mechanism TSM or rotation torque generated by the motor generator MG1 is transmitted to wheels via a transmission TM and a differential gear DEF. On the other hand, during operation of regenerative braking, rotation torque is transmitted from the wheels to the motor generator MG1. Alternating-current power is generated on the basis of the supplied rotation torque. As explained below, the generated alternating-current power is converted into direct-current power by a power converting device 200 to charge a battery 136 for a high voltage. The charged electric power is used as traveling energy again. When the electric power accumulated in the battery 136 for a high voltage decreases, rotation energy generated by the engine EGN is converted into alternating-current power by the motor generator MG2. Subsequently, the alternating-current power is converted into direct-current power by the power converting device 200 to charge the battery 136. The transmission of the mechanical energy from the engine EGN to the motor generator MG2 is performed by the power distributing mechanism TSM.

The power converting device 200 is explained. Inverter circuits 140 and 142 are electrically connected to the battery 136 via a direct-current connector 138. Electric power is exchanged between the battery 136 and the inverter circuit 140 or 142. When the motor generator MG1 is caused to operate as a motor, the inverter circuit 140 generates alternating-current power on the basis of direct-current power supplied from the battery 136 via the direct-current connector 138 and supplies the alternating-current power to the motor generator MG1 via an alternating-current terminal 188. A configuration including the motor generator MG1 and the inverter circuit 140 operates as a first motor generator unit. Similarly, when the motor generator MG2 is caused to operate as a motor, the inverter circuit 142 generates alternating-current power on the basis of direct-current power supplied from the battery 136 via the direct-current connector 138 and supplies the alternating-current power to the motor generator MG2 via alternating-current terminals 159. A configuration including the motor generator MG2 and the inverter circuit 142 operates as a second motor generator unit. In some case, both the first motor generator unit and the second motor generator unit are operated as motors or generators. In other cases, the first motor generator unit and the second motor generator unit are used properly and operated according to a driving state. One of the first motor generator unit and the second motor generator unit can also be stopped without being operated. In this embodiment, the first motor generator unit is caused to operate as a motor unit with the electric power of the battery 136, whereby it is possible to drive the vehicle only with the power of the motor generator MG1. Further, in this embodiment, the first motor generator unit or the second motor generator unit is caused to operate as a power generating unit with the power of an engine ENG or the power from the wheels to generate electric power, whereby it is possible to charge the battery 136.

The battery 136 is used as a power supply for driving an auxiliary machine motor 195 as well. The auxiliary machine motor 195 is, for example, a motor for driving a compressor of an air conditioner or a motor for driving a hydraulic pump for control. Direct-current power is supplied from the battery 136 to an auxiliary machine power module 350. Alternating-current power is generated by the auxiliary machine power module 350 and supplied to the auxiliary machine motor 195 via an alternating-current terminal 120. The auxiliary machine power module 350 basically has a circuit configuration and functions same as those of the inverter circuits 140 and 142 and controls the phase, the frequency, and the electric power of an alternating current supplied to the auxiliary machine motor 195. Since the capacity of the auxiliary machine motor 195 is smaller than the capacity of the motor generators MG1 and MG2, maximum converted power of the auxiliary machine power module 350 is smaller than that of the inverter circuits 140 and 142. However, as explained above, the basic configuration and the basic operation of the auxiliary machine power module 350 are substantially the same as those of the inverter circuits 140 and 142. The power converting device 200 includes a capacitor module 500 for smoothing direct-current power supplied to the inverter circuit 140 and the inverter circuit 142 and an inverter circuit 350B.

The power converting device 200 includes a communication connector 21 for receiving a command from a host control apparatus or transmitting data representing a state to the host control apparatus. A control circuit 172 calculates a control amount for the motor generator MG1 and the motor generator MG2 and the auxiliary machine motor 195 on the basis of a command from the connector 21 and calculates whether the motor generator MG1 and the motor generator MG2 and the auxiliary machine motor 195 are operated as motors or generators. The control circuit 172 generates control pulse on the basis of a calculation result and supplies the control pulse to a driver circuit 174 and a driver circuit 350B of The auxiliary machine power module 350. The auxiliary machine power module 350 may include an exclusive control circuit. In this case, the exclusive control circuit generates control pulse on the basis of a command from the connector 21 and supplies the control pulse to the driver circuit 350B of The auxiliary machine power module 350. The driver circuit 174 generates, on the basis of the control pulse, a driving pulse for controlling the inverter circuit 140 and the inverter circuit 142. A driver circuit 350B generates a control pulse for driving the inverter circuit 350B of the auxiliary machine power module 350.

The configuration of electric circuits of the inverter circuit 140 and the inverter circuit 142 is explained with reference to FIG. 2. The circuit configuration of the inverter 350B of the auxiliary machine power module 350 shown in FIG. 1 is also basically similar to the circuit configuration of the inverter circuit 140. Therefore, in FIG. 2, explanation of a specific circuit configuration of the inverter 350B is omitted and the inverter circuit 140 is explained as a representative example. However, since the auxiliary machine power module 350 has small output power, semiconductor chips that configure upper arms and lower arms of phases and circuits that connect the chips explained below are integrated and arranged in the auxiliary machine power module 350.

Further, the inverter circuit 140 and the inverter circuit 142 have extremely similar circuit configurations and operations. Therefore, the inverter circuit 140 is representatively explained.

In the following explanation, an insulated gate bipolar transistor is used as a semiconductor element. The insulated gate bipolar transistor is hereinafter abbreviated as IGBT. The inverter circuit 140 includes series circuits 150 of upper and lower arms to correspond to three phases formed by a U phase, a V phase, and a W phase of alternating-current power that the inverter circuit 140 is about to output. The series circuits 150 of the upper and lower arms are formed by IGBTs 328 and diodes 156 operating as the upper arms and IGBTs 330 and diodes 166 operating as the lower arms. In this embodiment, these three phases correspond to respective phase windings of three phases of an armature winding of the moor generator MG1. The series circuits 150 of the upper and lower arms of the respective three phases output an alternating current from an intermediate electrode 169, which is a middle point portion of the series circuits. This alternating current is output to alternating-current bus bars 802 and 804 explained below, which are alternating-current power lines to the motor generator MG1, through the alternating-current terminals 159 and the alternating-current terminal 188.

Collector electrodes 153 of the IGBTs 328 of the upper arms are electrically connected to capacitor terminals 506 on a positive electrode side of the capacitor module 500 via positive electrode terminals 157. Emitter electrodes of the IGBTs 330 of the lower arms are electrically connected to capacitor terminals 504 on a negative electrode side of the capacitor module 500 via negative electrode terminals 158.

As explained above, the control circuit 172 receives a control command from the host control apparatus via the connector 21, generates a control pulse on the basis of the control command, and supplies the control pulse to the driver circuit 174. The control pulse is a control signal for controlling the IGBTs 328 and the IGBTs 330 that configure the upper arms or the lower arms of the series circuits 150 of the phases that configure the inverter circuit 140. The driver circuit 174 supplies, on the basis of the control pulse, a driving pulse for controlling the IGBTs 328 and the IGBTs 330 that configure the upper arms or the lower arms of the series circuits 150 of the phases to the IGBTs 328 and the IGBTs 330 of the phases. The IGBTs 328 and the IGBTs 330 perform a conduction or interruption operation on the basis of the driving pulse from the driver circuit 174 and convert direct-current power supplied from the battery 136 into three-phase alternating-current power. This converted electric power is supplied to the motor generator MG1.

The IGBTs 328 include the collector electrodes 153, emitter electrodes for signal 155, and gate electrodes 154. The IGBTs 330 include collector electrodes 163, emitter electrodes for signal 165, and gate electrodes 164. The diodes 156 are electrically connected between the collector electrodes 153 and the emitter electrodes 155. The diodes 166 are electrically connected between the collector electrodes 163 and the emitter electrodes 165. A metal oxide semiconductor field effect transistor (hereinafter abbreviated as MOSFET) may be used as a power semiconductor element for switching. In this case, the diodes 156 and the diodes 166 are unnecessary. As the power semiconductor for switching, an IGBT is suitable when a direct-current voltage is relatively high and a MOSFET is suitable when the direct-current voltage is relatively low.

The capacitor module 500 includes a plurality of the capacitor terminals 506 on the positive electrode side, a plurality of capacitor terminals 504 on the negative electrode side, a power supply terminal 509 on the positive electrode side, and a power supply terminal 508 on the negative electrode side. The high-voltage direct-current power from the battery 136 is supplied to the power supply terminal 509 on the positive electrode side and the power supply terminal 508 on the negative electrode side via the direct-current connector 138. The high-voltage direct-current power is supplied from the plurality of capacitor electrodes 506 on the positive electrode side and the plurality of capacitor electrodes 504 on the negative electrode side of the capacitor module 500 to the inverter circuit 140 and the inverter circuit 142 and The auxiliary machine power module 350. On the other hand, the direct-current power converted from the alternating-current power by the inverter circuit 140 and the inverter circuit 142 is supplied from the capacitor terminals 506 on the positive electrode side and the capacitor terminals 504 on the negative electrode side to the capacitor module 500. The direct-current power is supplied from the power supply terminal 509 on the positive electrode side and the power supply terminal 508 on the negative electrode side to the battery 136 via the direct-current connector 138 and accumulated in the battery 136.

The control circuit 172 includes a microcomputer for subjecting switching timing of the IGBTs 328 and the IGBTs 330 to arithmetic processing. As input information to the microcomputer, there are a target torque value requested to the motor generator MG1, a current value supplied from the upper and lower arm series circuits 150 to the motor generator MG1, and a magnetic pole position of the rotor of the motor generator MG1. The target torque value is based on a command signal output from a not-shown host control apparatus. The current value is detected on the basis of a detection signal output by a current sensor 180. The magnetic pole position is detected on the basis of a detection signal output from a rotating magnetic pole sensor (not shown) such as a resolver provided in the motor generator MG1. In an example explained in this embodiment, the current sensor 180 detects current values for three phases. However, the current sensor 180 may detect current values for two phases. Electric currents for three phases may be calculated by an arithmetic operation.

The microcomputer in the control circuit 172 calculates current command values of d and q axes of the motor generator MG1 on the basis of the target torque value, calculates voltage command values of the d and q axes on the basis of differences between the current command values of the d and q axes and detected current values of the d and q axes, and converts the calculated voltage command values of the d and q axes into voltage command values of the U phase, the V phase, and the W phase on the basis of a detected magnetic pole position. The microcomputer generates a pulse-like modulated wave on the basis of comparison of a fundamental wave (a sine wave) based on the voltage command values of the U phase, the V phase, and the W phase and a carrier wave (a triangular wave) and outputs this generated modulated wave to the driver circuit 174 as a PWM (pulse width modulation) signal. When driving the lower arms, the driver circuit 174 outputs a drive signal obtained by amplifying the PWM signal to the gate electrodes of the IGBTs 330 of the corresponding lower arms. When driving the upper arms, the driver circuit 174 shifts a level of reference potential of the PWM signal to a level of reference potential of the upper arms, then amplifies the PWM signal, and output the PWM signal to the gate electrodes of the IGBTs 328 of the corresponding upper arms as a drive signal.

The microcomputer in the control circuit 172 performs abnormality detection (overcurrent, overvoltage, overtemperature, etc.) and protects the upper and lower arm series circuits 150. Therefore, sensing information is input to the control circuit 172. For example, information concerning an electric current flowing to the emitter electrodes of the IGBTs 328 and the IGBTs 330 is input from the emitter electrodes for signal 155 and the emitter electrodes for signal 165 of the arms to driving sections (ICs) corresponding to the emitter electrodes. Consequently, the driving sections (ICs) perform overcurrent detection. When overcurrent is detected, the driving sections (ICs) stop a switching operation of the IGBTs 328 and the IGBTs 330 corresponding to the driving sections and protect the corresponding IGBTs 328 and the IGBTs 330 from the overcurrent. Information concerning the temperature of the upper and lower arm series circuits 150 is input from temperature sensors (not shown) provided in the upper and lower arm series circuits 150 to the microcomputer. Information concerning voltages on the direct-current positive electrode side of the upper and lower arm series circuits 150 is input to the microcomputer. The microcomputer performs overtemperature detection and overvoltage detection on the basis of those kinds of information. When overtemperature or overvoltage is detected, the microcomputer stops the switching operation of all the IGBTs 328 and IGBTs 330.

Figure 3:
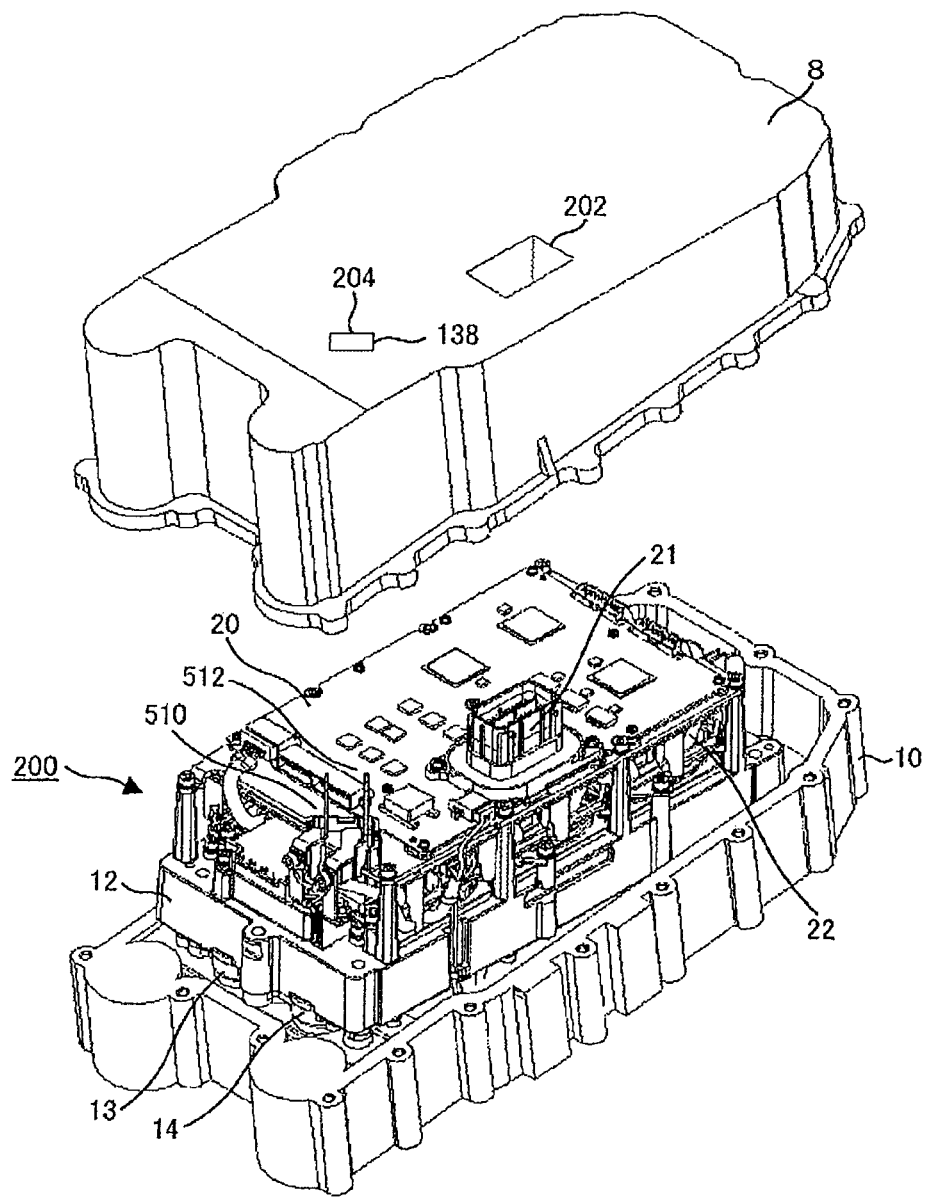
FIG. 3 is an exploded perspective view for explaining a setting place of a power converting device 200 according to an embodiment.

FIG. 3 shows an exploded perspective view of the power converting device 200 according to an embodiment of the present invention. The power converting device 200 includes a housing 10, which has a bottom of aluminum for housing circuit components of the power converting device 200 fixed to the transmission TM, and a lid 8. Since the shape of the bottom surface and the top surface of the power converting device 200 is formed in a substantially rectangular shape, there is an effect that it is easy to attach the power converting device 200 to the vehicle and easy to manufacture the power converting device 200. A channel forming body 12 holds a power module 300 explained below and the capacitor module 500 and cools these modules with a cooling medium. The channel forming body 12 is fixed to the housing 10. An inlet pipe 13 and an outlet pipe 14 are provided in the bottom of the housing 10. Water serving as the cooling medium flows into the channel forming body 12 from the inlet pipe 13 and flows out from the outlet pipe 14 after being used for cooling.

The lid 8 houses circuit components that configure the power converting device 200. The lid 8 is fixed to the housing 10. In an upper part on the inner side of the lid 8, a control circuit board 20 mounted with the control circuit 172 is arranged. A first opening 202 and a second opening 204 connected to the outside are provided in the lid 8. The connector 21 is connected to an external control apparatus via the first opening 202. Signal transmission is performed between the control circuit 172 provided on the control circuit board 20 and the external control apparatus such as the host control apparatus. Low-voltage direct-current power for causing the control circuit in the power converting device 200 to operate is supplied from the connector 21. The direct-current connector 138 for transmitting and receiving direct-current power between the power converting device 200 and the battery 136 is provided in the second opening 204. A negative electrode side power line 510 and a positive electrode side power line 512 for supplying high-voltage direct-current power to the inside of the power converting device 200 electrically connect the direct-current connector 138 and the capacitor module 500 that perform exchange of direct-current power with the battery 136.

The connector 21 and the negative electrode side power line 510 and the positive electrode side power line 512 are extended to the bottom surface of the lid 8. The connector 21 projects from the first opening 202. The distal ends of the negative electrode side power line 510 and the positive electrode side power line 512 project from the second opening 204 and configure terminals of the direct-current connector 138. In the lid 8, a seal member (not shown) is provided around the first opening 202 and the second opening 204 on the inner wall of the lid 8. The directions of fitting surfaces of the terminals such as the connector 21 are various directions depending on car models. In particular, when the power converting device 200 is intended to be mounted on a small vehicle, it is desirable to project the terminals with the fitting surfaces facing up from the viewpoint of limitation of the size in an engine room and assemblability. In particular, when the power converting device 200 is arranged above the transmission TM as in this embodiment, the terminals are projected to the opposite side of an arrangement side of the transmission TM, whereby workability is improved. The connector 21 needs to be sealed from the external atmosphere. In this embodiment, since the lid 8 is assembled to the connector 21 from an upper direction, when the lid 8 is assembled to the housing 10, a seal member in contact with the lid 8 can press the connector 21. As a result, air tightness is improved.

Figure 4:
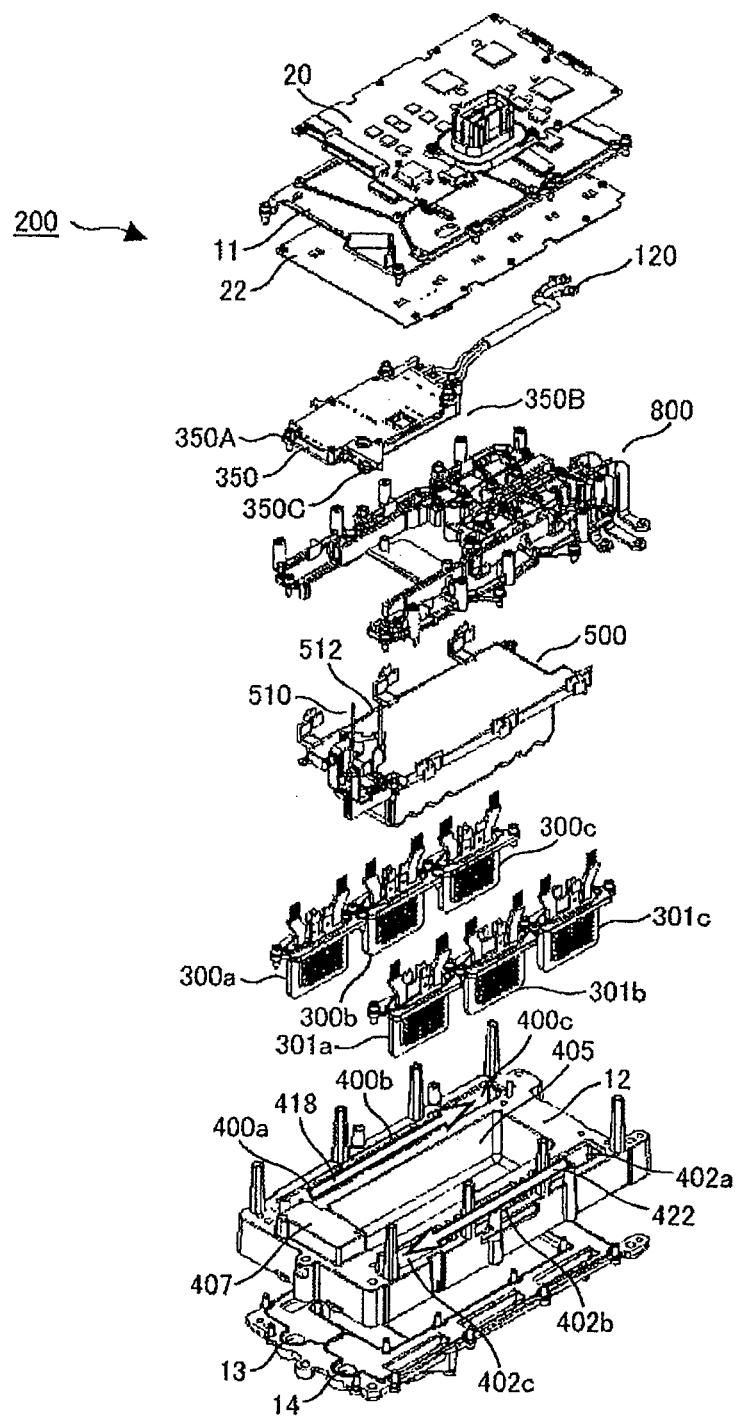
FIG. 4 is a perspective view of an overall configuration of the power converting device according to the embodiment disassembled into respective components.
Figure 5:
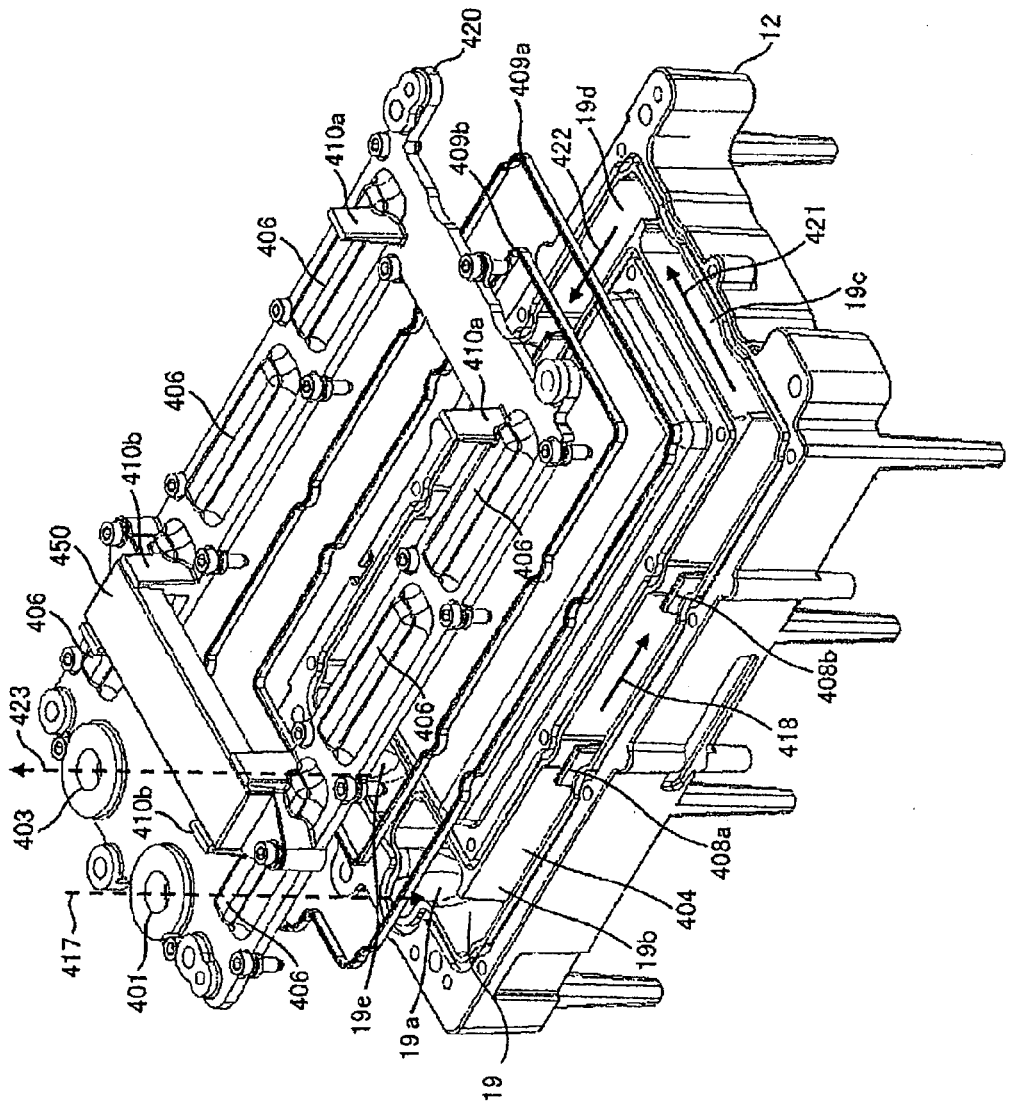
FIG. 5 is a lower surface diagram of a cooling jacket 12 including channels 19.

FIG. 4 is a diagram showing components housed on the inside of the housing 10 of the power converting device 200. FIG. 4 is shown as an exploded perspective view to assist understanding. In the channel forming body 12, channels 19 shown in FIG. 5 are formed along both sides of the channel forming body 12. On the upper surface on one side of the channels 19, opening sections 400a to 400c are formed along a flowing direction 418 of a coolant. On the upper surface on the other side of the channels 19, opening sections 402a to 402c are formed along a flowing direction 422 of the coolant. The opening sections 400a to 400c are closed by inserted power modules 300a to 300c. The opening sections 402a to 402c are closed by inserted power modules 301a to 301c.

Between one and the other channels formed by the channel forming body 12, a housing space 405 for housing the capacitor module 500 is formed. The capacitor module 500 is housed in the housing space 405, whereby the capacitor module 500 is cooled by the coolant flowing in the channels 19. Since the channels for feeding the coolant are formed along the outer side surfaces of the capacitor module 500, cooling efficiency is improved, arrangement of the channels, the capacitor module 500, and the power modules 300 and 301 is set in order, and the entire power converting device 200 is further reduced in size. The channels 19 are arranged along the long sides of the capacitor module 500. The distance between the power modules 300 and 301 inserted into and fixed to the channels 19 and the channels 19 is substantially fixed. Therefore, circuit constants of a smoothing capacitor and a power module circuit are easily balanced in layers of the three phases. A circuit configuration in which a spike voltage is easily reduced is obtained. In this embodiment, water is most suitable as the coolant. However, since liquid other than the water can also be used, the coolant is hereinafter referred to as coolant.

In the channel forming body 12, a cooling section 407 including, on the inside, a space for changing a flow of the coolant is provided in a position opposed to the inlet pipe 13 and the outlet pipe 14. The cooling section 407 is formed integrally with the channel forming body 12. In this embodiment, the cooling section 407 is used to cool the auxiliary machine power module 350. The auxiliary machine power module 350 is fixed to a cooling surface, which is the outer peripheral surface, of the cooling section 407. The auxiliary machine power module 350 stores the coolant in a space formed on the inner side of the cooling surface. The cooling section 407 is cooled by this coolant and a temperature rise of the auxiliary machine power module 350 is suppressed. The coolant is a coolant flowing in the channels 19. The auxiliary machine power module 350 is cooled together with the power modules 300 and 301 and the capacitor module 500. A bus bar assembly 800 explained below is arranged on both sides of the auxiliary machine power module 350. The bus bar assembly 800 includes an alternating-current bus bar 186 and a holding member. The bus bar assembly 800 holds and fixes the current sensor 180. Details are explained below.

As explained above, the housing space 405 for the capacitor module 500 is provided in the center of the channel forming body 12. The channels 19 are provided to hold the housing space 405. The power modules 300a to 300c and the power modules 301a to 301c for vehicle driving are arranged in the respective channels 19. Further, the auxiliary machine power module 350 is arranged on the upper surface of the channel forming body 12. Consequently, it is possible to efficiently perform cooling in a small space and reduce the size of the entire power converting device.

A main structure of the channels 19 of the channel forming body 12 is formed by casting of an aluminum material integrally with the channel forming body 12. Therefore, in addition to a cooling effect, the channels 19 have an effect of increasing mechanical strength. Since the main structure of the channels 19 is formed by the aluminum casting, the channel forming body 12 and the channels 19 are formed as an integral structure. Consequently, heat conduction is improved and the cooling effect is improved. The power modules 300a to 300c and the power modules 301a to 301c are fixed to the channels 19 to complete the channels 19 and perform a water leak test of a water channel. When the water channel passes the water leak test, work for attaching the capacitor module 500, the auxiliary machine power module 350, and a substrate can be performed next. In this way, the power converting device 200 is configured such that the work for arranging the channel forming body 12 in the bottom of the power converting device 200 and then fixing necessary components such as the capacitor module 500, the auxiliary machine power module 350, the bus bar assembly 800, and the substrate can be sequentially performed from the top. Therefore, productivity and reliability are improved.

A driver circuit board 22 is arranged above the auxiliary machine power module 350 and the bus bar assembly 800, i.e., on the lid side. A metal base plate 11 is arranged between the driver circuit board 22 and the control circuit board 20. The metal base plate 11 realizes a function of an electromagnetic shield for circuit groups mounted on the driver circuit board 22 and the control circuit board 20 and has action of allowing heat generated by the driver circuit board 22 and the control circuit board 20 to escape and cooling the driver circuit board 22 and the control circuit board 20. Further, the metal base plate 11 has action of increasing a mechanical resonant frequency of the control circuit board 20. Specifically, it is possible to arrange, at a short interval, screwing portions for fixing the control circuit board 20 to the metal base plate 11, reduce the distance between supporting points when mechanical oscillation occurs, and increase a resonant frequency. Since the resonant frequency of the control circuit board 20 can be increased with respect to an oscillation frequency transmitted from a transmission, the control circuit board 20 is less easily affected by oscillation and reliability is improved.

FIG. 5 is an explanatory diagram for explaining the channel forming body 12 and is a diagram of the channel forming body 12 shown in FIG. 4 viewed from below. The channel forming body 12 and the channels 19 formed along the housing space 405 (see FIG. 4) of the capacitor module 500 on the inside of the channel forming body 12 are integrally casted. One continuous opening section 404 is formed on the lower surface of the channel forming body 12. The opening section 404 is closed by a lower cover 420 having an opening in the center. A seal member 409a and a seal member 409b are provided between the lower cover 420 and the channel forming body 12 to keep air tightness.

In the lower cover 420, an inlet hole 401 for inserting the inlet pipe 13 (see FIG. 4) and an outlet hole 403 for inserting the outlet pipe 14 (see FIG. 4) are formed near one end side and along the end side. Further, in the lower cover 420, convex sections 406 projecting in an arrangement direction of the transmission TM are formed. Convex sections 406 are provided to correspond to the power modules 300a to 300c and the power modules 301a to 301c. The coolant flows, through the inlet hole 401, in the direction of a flowing direction 417 indicated by a broken line toward a first channel section 19a formed along the side in the latitudinal direction of the channel forming body 12. The first channel section 19a forms a space for changing the flow of the coolant. The coolant collides against the inner surface of the cooling section 407 in the space and changes the direction of the flow. The coolant has action of depriving heat of the cooling section 407 during the collision. As indicated by a flowing direction 418, the coolant flows in a second channel section 19b formed along the side in the longitudinal direction of the channel forming body 12. As indicated by a flowing direction 421, the coolant flows in a third channel section 19c formed along the side in the latitudinal direction of the channel forming body 12. The third channel section 19c forms a return channel. As indicated by a flowing direction 422, the coolant flows in a fourth channel section 19d formed along the side in the longitudinal direction of the channel forming body 12. The fourth channel section 19d is provided in a position opposed to the second channel section 19b across the capacitor module 500. Further, as indicated by a flowing direction 423, the coolant flows out to the outlet pipe 14 through a fifth channel section 19e formed along the side in the latitudinal direction of the channel forming body 12 and the outlet hole 403.

All of the first channel section 19a, the second channel section 19b, the third channel section 19c, the fourth channel section 19d, and the fifth channel section 19e are formed larger in the depth direction than in the width direction. The power modules 300a to 300c are inserted from the opening sections 400a to 400c formed on the upper surface side of the channel forming body 12 (see FIG. 4) and housed in a housing space in the second channel section 19b. An intermediate member 408a for preventing the flow of the coolant from stagnating is formed between a housing space of the power module 300a and a housing space of the power module 300b. Similarly, an intermediate member 408b for preventing the flow of the coolant from stagnating is formed between a housing space of the power module 300b and a housing space of the power module 300c. The intermediate member 408a and the intermediate member 408b are formed such that principal planes thereof extend along the flowing direction of the coolant. Like the second, channel section 19b, the fourth channel section 19d forms housing spaces and intermediate members of the power modules 301a to 301c. The channel forming body 12 is formed such that the opening section 404 and the opening sections 400a to 400c and 402a to 402c are opposed to each other. Therefore, the channel forming body 12 is formed in a configuration easily manufactured by aluminum casting.

In the lower cover 420, a supporting section 410a and a supporting section 410b for coming into contact with the housing 10 and supporting the power converting device 200 are provided. The supporting section 410a is provided close to one end side of the lower cover 420. The supporting section 410b is provided close to the other end side of the lower cover 420. Consequently, the channel forming body 12 of the power converting device 200 can be firmly fixed to the inner wall of the housing 10 formed to match a columnar shape of the transmission TM and the motor generator MG1.

The supporting section 410b is configured to support a resistor 450. The resistor 450 is a device for discharging charges accumulated in a capacitor cell taking into account passenger protection and safety during maintenance. The resistor 450 is configured to be capable of continuously discharging high-voltage electricity. However, the resistor 450 needs to be configured to minimize damage to the vehicle even if some abnormality occurs in the resistor or a discharge mechanism. In other words, when the resistor 450 is arranged around the power modules, the capacitor module, the driver circuit board, and the like, if the resistor 450 causes a deficiency such as heat generation or firing, it is likely that fire spreads near main components.

Therefore, in this embodiment, the power modules 300a to 300c, the power modules 301a to 301c, and the capacitor module 500 are arranged on the opposite side of the housing 10, in which the transmission TM is housed, across the channel forming body 12. The resistor 450 is arranged in a space between the channel forming body 12 and the housing 10. Consequently, the resistor 450 is arranged in a closed space surrounded by the channel forming body 12 and the housing 10 formed of metal. The charges accumulated in the capacitor cell in the capacitor module 500 is controlled to be discharged to the resistor 450 via a wire, which passes the side of the channel forming body 12, according to a switching action of switching means mounted on the driver circuit board 22 shown in FIG. 4. In this embodiment, the charges are controlled to be discharged at high speed by the switching means. Since the channel forming body 12 is provided between the driver circuit board 22, which controls the discharge, and the resistor 450, the driver circuit board 22 can be protected from the resistor 450. The resistor 450 is fixed to the lower cover 420. Therefore, the resistor 450 is provided in a position extremely close to the channels 19. Abnormal heat generation of the resistor 450 can be suppressed.

Figure 6:
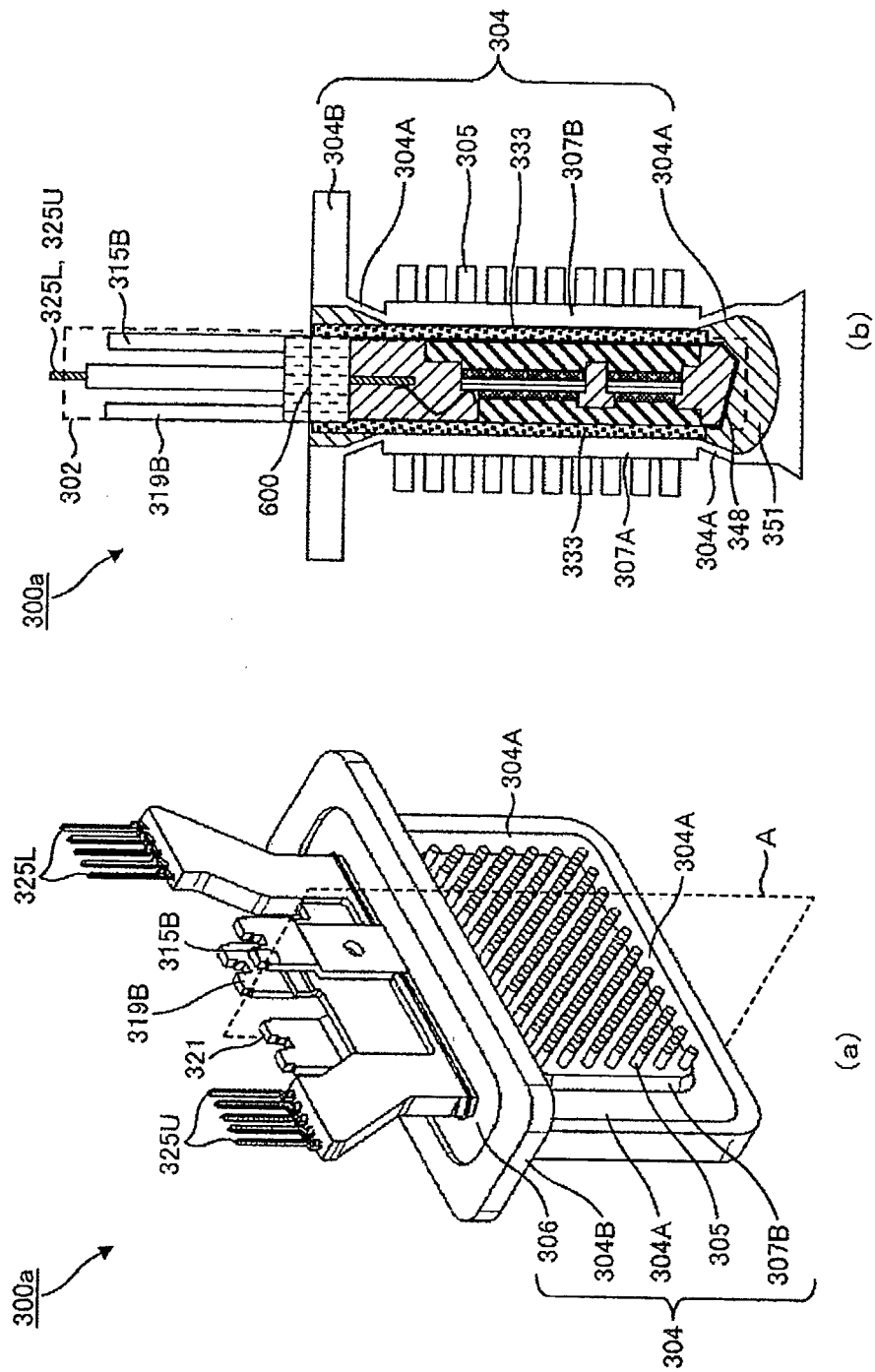
FIG. 6(a) is a perspective view of a power module 300a in the embodiment.
FIG. 6(b) is a sectional view of the power module 300a in the embodiment.
Figure 7:
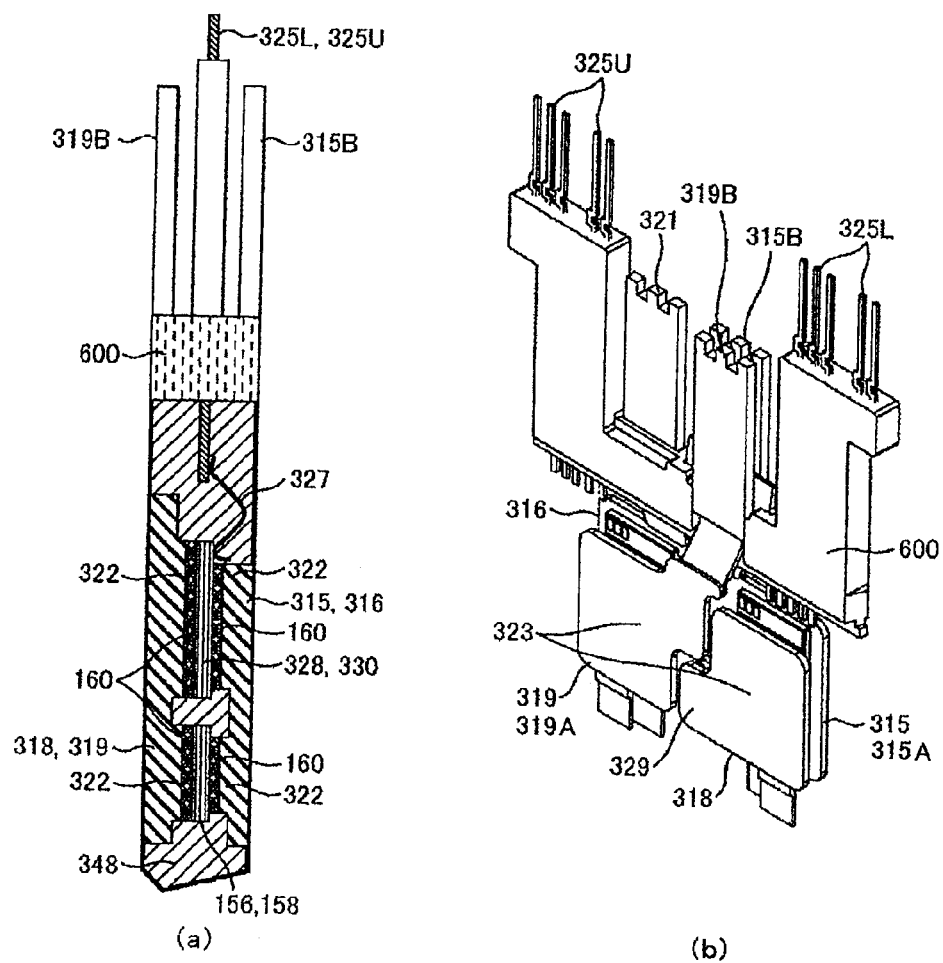
FIG. 7(a) is an internal sectional view in which a module case 304, an insulating sheet 333, and second sealing resin 351 are removed to assist understanding.
FIG. 7(b) is an internal perspective view in which first sealing resin 348 is removed from FIG. 7(a)

A detailed configuration of the power modules 300a to 300c and the power modules 301a to 301c used in the inverter circuit 140 and the inverter circuit 142 is explained with reference to FIGS. 6 and 7. All of the power modules 300a to 300c and the power modules 301a to 301c have the same structure. The structure of the power module 300a is representatively explained. In FIGS. 6 and 7, signal terminals 325U correspond to the gate electrodes 154 and the emitter electrodes for signal 155 shown in FIG. 2 and signal terminals 325L correspond to the gate electrodes 164 and the emitter electrodes 165 shown in FIG. 2. A direct-current positive electrode terminal 315B is the same as the positive electrode terminal 157 shown in FIG. 2. A direct-current negative electrode terminal 319B is the same as the negative electrode terminal 158 shown in FIG. 2. An alternating-current terminal 321 is the same as the alternating-current terminal 159 shown in FIG. 2.

FIG. 6(a) is a perspective view of the power module 300a in this embodiment. FIG. 6(b) is a sectional view of the power module 300a in this embodiment.

As shown in FIGS. 6 and 7, the power semiconductor elements (the IGBTs 328, the IGBTs 330, the diodes 156, and the diodes 166) that configure the series circuits 150 of the upper and lower arms are held from both sides and firmly fixed by a conductor plate 315 and a conductor plate 318 or by a conductor plate 316 and a conductor plate 319. An auxiliary mold body 600 formed by integrally molding signal wires, which are the signal terminals 325U and the signal terminals 325L, is assembled to these conductor plates. The conductor plate 315 and the like are sealed by first sealing resin 348 in a state in which heat radiation surfaces thereof are exposed. An insulating sheet 333 is thermally compression-bonded to the heat radiation surfaces. A module primary sealing body 302 sealed by the first sealing resin 348 is inserted into the module case 304 and thermally compression-bonded to the inner surface of the module case 304, which is a CAN-type cooler, across the insulating sheet 333. The CAN-type cooler is a cooler formed in a cylindrical shape having an insertion port 306 on one surface and having a bottom on the other surface.

The module case 304 is formed of an aluminum alloy material such as Al, AlSi, AlSiC, or Al—C and integrally molded in a seamless state. The module case 304 has structure in which an opening is not provided other than the insertion port 306. The outer periphery of the insertion port 306 is surrounded by a flange 304B. As shown in FIG. 6(a), a first radiator 307A and a second radiator 307B having surfaces wider than other surfaces are arranged to be opposed to each other. Three surfaces connecting the first radiator 307A and the second radiator 307B opposed to each other form surfaces closed at width narrower than the first radiator 307A and the second radiator 307B. The insertion port 306 is formed in the surface of the remaining one side. The shape of the module case 304 does not need to be an accurate rectangular parallelepiped. Corners of the module case 304 may form curved surfaces as shown in FIG. 6(a).

Since the case made of metal having such a shape is used, even if the module case 304 is inserted into the channels 19 in which the coolant such as water or oil flows, seal against the coolant can be secured by the flange 304B. Therefore, it is possible to prevent, with a simple configuration, a cooling medium from intruding into the inside of the module case 304. Fins 305 are respectively uniformly formed on the first radiator 307A and the second radiator 307B opposed to each other. Further, thin sections 304A, having extremely small thickness, are formed on the outer peripheries of the first radiator 307A and the second radiator 307B. The thickness of the thin sections 304A is set extremely small to a degree at which the thin sections 304A are easily deformed by pressurizing the fins 305. Therefore, productivity after the insertion of the module primary sealing body 302 is improved.

Figure 8:
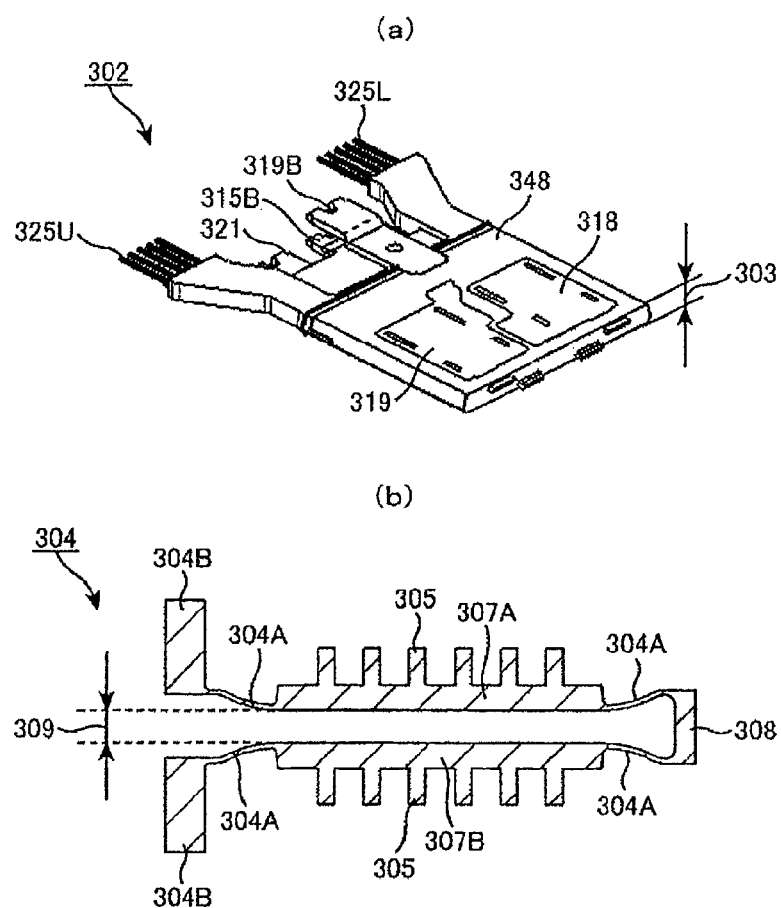
FIG. 8(a) is a perspective view of a module primary sealing body 302.
FIG. 8(b) is a sectional view of the module case 304 viewed from a cross section A of FIG. 6(a)
Figure 9:
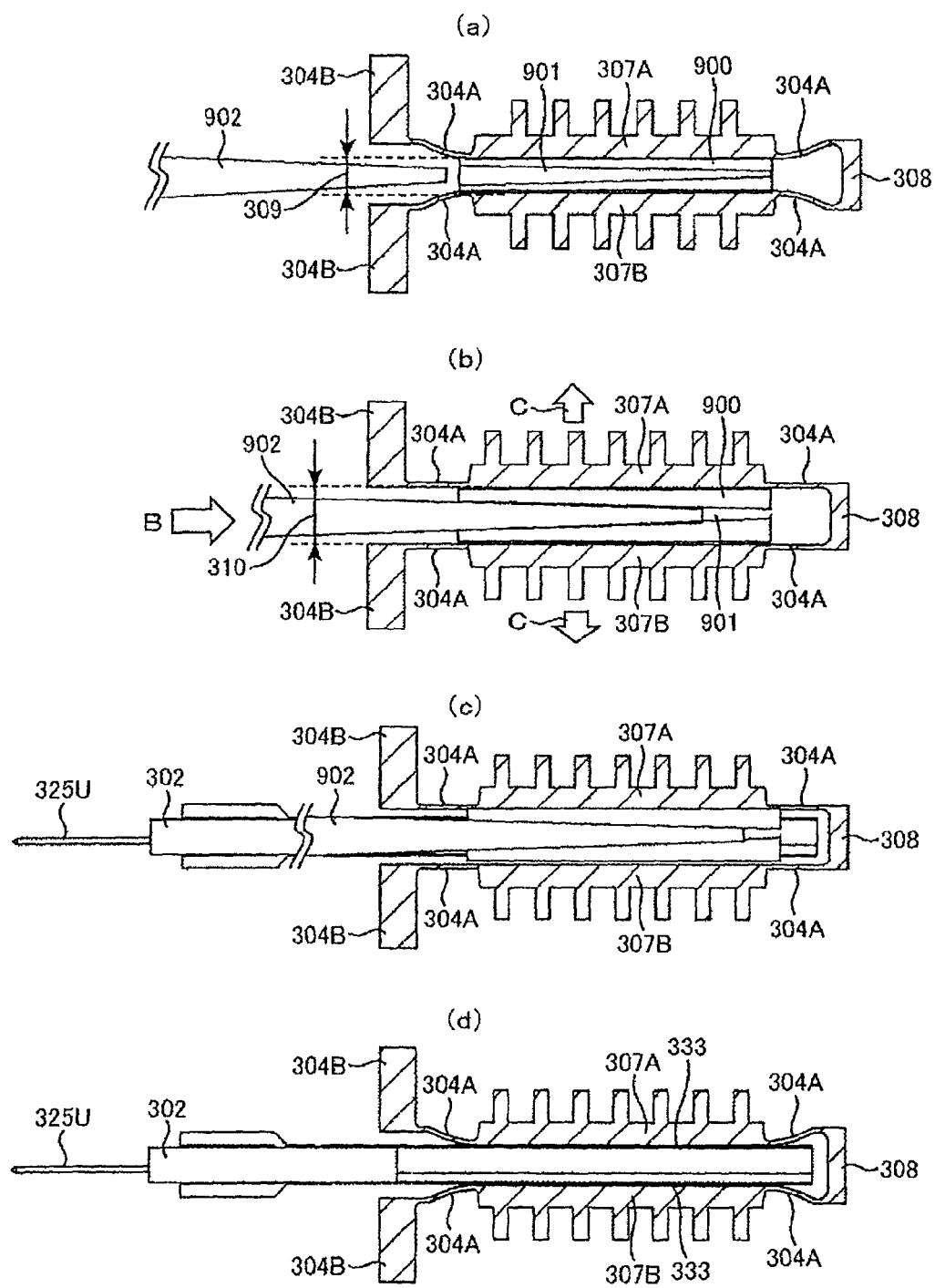
FIGS. 9(a) to 9(d) are process charts showing a process for inserting the module primary sealing body 302 into the module case 304.

Second sealing resin 351 is filled in an air gap remaining on the inside of the module case 304. As shown in FIGS. 8 and 9, a direct-current positive electrode wire 315A and a direct-current negative electrode wire 319A for electrical connection to the capacitor module 500 are provided. The direct-current positive electrode terminal 315B (157) and the direct-current negative electrode terminal 319B (158) are formed at the distal ends of the direct-current positive electrode wire 315A and the direct-current negative electrode wire 319A. An alternating-current wire 320 for supplying alternating-current power to the motor generator MG1 or MG2 is provided. The alternating-current terminal 321 (159) is formed at the distal end of the alternating-current wire 320. In this embodiment, the direct-current positive electrode wire 315A is integrally molded with the conductor plate 315, the direct-current negative electrode wire 319A is integrally molded with the conductor plate 319, and the alternating-current wire 320 is integrally molded with the conductor plate 316.

The conductor plate 315 and the like are thermally compression bonded to the inner wall of the module case 304 via the insulating sheet 333 as explained above. Consequently, it is possible to reduce an air gap between the conductor plates and the inner wall of the module case 304 and efficiently transmit generated heat of the power semiconductor elements to the fins 305. Further, by imparting certain degrees of thickness and flexibility to the insulating sheet 333, it is possible to absorb generation of thermal stress with the insulating sheet 333. This is satisfactory for use in a power converting device for a vehicle in which a temperature change is intense.

FIG. 7(a) is an internal sectional view in which the module case 304, the insulating sheet 333, and the second sealing resin 351 are removed to assist understanding. FIG. 7(b) is an internal perspective view in which the first sealing resin 348 is removed from FIG. 7(a).

The power semiconductor elements are respectively firmly fixed to, via metal joining materials 160, element firmly fixing sections 322 provided in the conductor plates. The metal joining materials 160 are, for example, low-temperature sintered joining materials including a solder material, a silver sheet, and fine metal particles.

The power semiconductor elements have tabular flat structure. Electrodes of the power semiconductor elements are formed on front and rear surfaces. As shown in FIG. 7, the electrodes of the power semiconductor elements are held by the conductor plate 315 and the conductor plate 318 or the conductor plate 316 and the conductor plate 319. In other words, the conductor plate 315 and the conductor plate 318 are laminated and arranged to be opposed to each other substantially in parallel via the IGBTs 328 and the diodes 156. Similarly, the conductor plate 316 and the conductor plate 319 are laminated and arranged to be opposed to each other substantially in parallel via the IGBTs 330 and the diodes 166. The conductor plate 316 and the conductor plate 318 are connected via an intermediate electrode 329. The upper arm circuits and the lower arm circuits are electrically connected by this connection and the upper and lower arm series circuits are formed. A heat radiation surface 323 is exposed from the first sealing resin 348 and covered with the insulating sheet shown in FIG. 6.

The direct-current positive electrode wire 315A and the direct-current negative electrode wire 319A are formed in shapes extending substantially in parallel in a state in which the direct-current positive electrode wire 315A and the direct-current negative electrode wire 319A are opposed to each other via the auxiliary mold body 600 molded with a resin material. The signal terminals 325U and the signal terminals 325L are molded integrally with the auxiliary mold body 600. The signal terminals 325U and the signal terminals 325L extend in the same direction as the direct-current positive electrode wire 315A and the direct-current negative electrode wire 319A. As a resin material used in the auxiliary mold body 600, thermosetting resin or thermoplastic resin having insulation properties is suitable. Consequently, it is possible to secure insulation between the direct-current positive electrode wire 315A and the direct-current negative electrode wire 319A and the signal terminals 325U and the signal terminals 325L and lay high-density wiring. Further, since the direct-current positive electrode wire 315A and the direct-current negative electrode wire 319A are arranged to be opposed to each other substantially in parallel, electric currents instantaneously flowing during the switching operation of the power semiconductor elements flow while being opposed to each other and in opposite directions. Consequently, electric fields formed by the electric currents have action of offsetting each other. A reduction in inductance can be performed by this action.

FIG. 8(a) is a perspective view of the module primary sealing body 302. FIG. 8(b) is a sectional view of the module case 304 viewed from a cross section A of FIG. 6(a).

In order to efficiently cool the semiconductor elements, it is important to prevent air gaps from being formed between the conductor plates 315, 316, 318, and 319, to which the semiconductor elements are connected, and the first radiator 307A and the second radiator 307B. However, since thickness 303 of the module primary sealing body 302 fluctuates, air gaps tend to be formed between the module primary sealing body 302 and the first radiator 307A and the second radiator 307B and cooling performance is deteriorated. On the other hand, if high-precision components are used or high-precision assembly and machining are performed to reduce the fluctuation in the thickness 303, improvement of productivity and a reduction in costs are hindered.

As shown in FIG. 8(b), the module case 304 includes the thin sections 304A that connect the flange 304B and the first radiator 307A and the second radiator 307B. The module case 304 includes the thin sections 304A that connect a frame body 308 and the first radiator 307A and the second radiator 307B. In other words, the thin sections 304A function as intermediate members that connect the flange 304B, the first radiator 307A and the second radiator 307B, and the frame body 308. The thickness of the frame body 308 is set larger than the thickness of the thin sections 304A in order to improve the strength of the module case 304.

Reference numeral 309 denotes the distance between the inner wall of the first radiator 307A and the inner wall of the second radiator 307B (hereinafter referred to as inter-inner wall distance 309). The module case 304 is formed such that the inter-inner wall distance 309 is smaller than the thickness 303 of the module primary sealing body 302.

FIGS. 9(a) to 9(d) are process charts showing a process for inserting the module primary sealing body 302 into the module case 304.

As shown in FIG. 9(a), a jig 900 having thickness substantially the same as the inter-inner wall distance 309 is inserted into the module case 304. The jig 900 is fixed in the module case 304 in a state in which the upper surface of the jig 900 is in contact with the first radiator 307A and the lower surface of the jig 900 is in contact with the second radiator 307B. In the jig 900, a space 901 for inserting a jig 902 is formed. The height of this space 901 is formed larger on the insertion port 306 side of the module case 304 than on the frame body 308 side shown in FIG. 9(a) and formed to gradually decrease toward the frame body 308 side.

Subsequently, as shown in FIG. 9(b), the jig 902 is inserted into the space 901 of the jig 900. The jig 902 is pressurized in a pressurizing direction B. The jig 902 is formed to be thinner toward the distal end thereof to be fit in the space 901 of the jig 900. The jig 902 is pressurized in the pressurizing direction B, whereby the jig 900 is deformed in a transitioning direction C and the module case 304 is expanded by the jig 900. Pressurizing force of the jig 902 is set such that an inter-inner wall distance 310 after the expansion of the module case 304 is larger than the thickness 303 of the module primary sealing body 302.

At this point, the thin sections 304A are formed extremely thinner than the cooling bodies forming the first radiator 307A and the second radiator 307B, the flange 304B, and the frame body 308. Only the thin sections 304A are elastically deformed.

Subsequently, as shown in FIG. 9(c), the module primary sealing body 302 is inserted into the module case 304.

Subsequently, as shown in FIG. 9(d), the jig 900 and the jig 902 are removed from the module case 304. The pressurizing force for elastically deforming the thin sections 304A is released. When the pressurizing force is released, elastic force to return to the inter-inner wall distance 309 of the module case 304 acts on the elastically-deformed thin sections 304A. The module primary sealing body 302 is supported and fixed by the first radiator 307A and the second radiator 307B. Since the elastic force from the thin sections 304A acts from both sides of the upper surface and the lower surface, the module primary sealing body 302 is more firmly supported and fixed. The inter-inner wall distance of the module case 304 is the same size as the thickness 303 of the module primary sealing body 302.

Consequently, it is possible to easily absorb fluctuation in the dimension of the thickness 303 of the module primary sealing body 302.

Surfaces of the first radiator 307A and the second radiator 307B on a side opposed to the module primary sealing body 302 are formed to be flush with surfaces of the thin sections 304A on the inner side of the module case 304. Consequently, it is possible to smoothly insert the jig 900 into the inside of the module case 304.

In the example explained in this embodiment, the thin sections 304A are elastically deformed. However, the inter-inner wall distance 309 and the thickness of the thin sections 304A of the module case 304 may be set such that the thin sections 304A are plastically deformed when the module primary sealing body 302 is inserted into the module case 304. When the thin sections 304A are plastically deformed, it is more desirable to improve joining force of the module case 304 and the module primary sealing body 302 by imparting adhesiveness to the insulating sheet 333.

Figure 10:
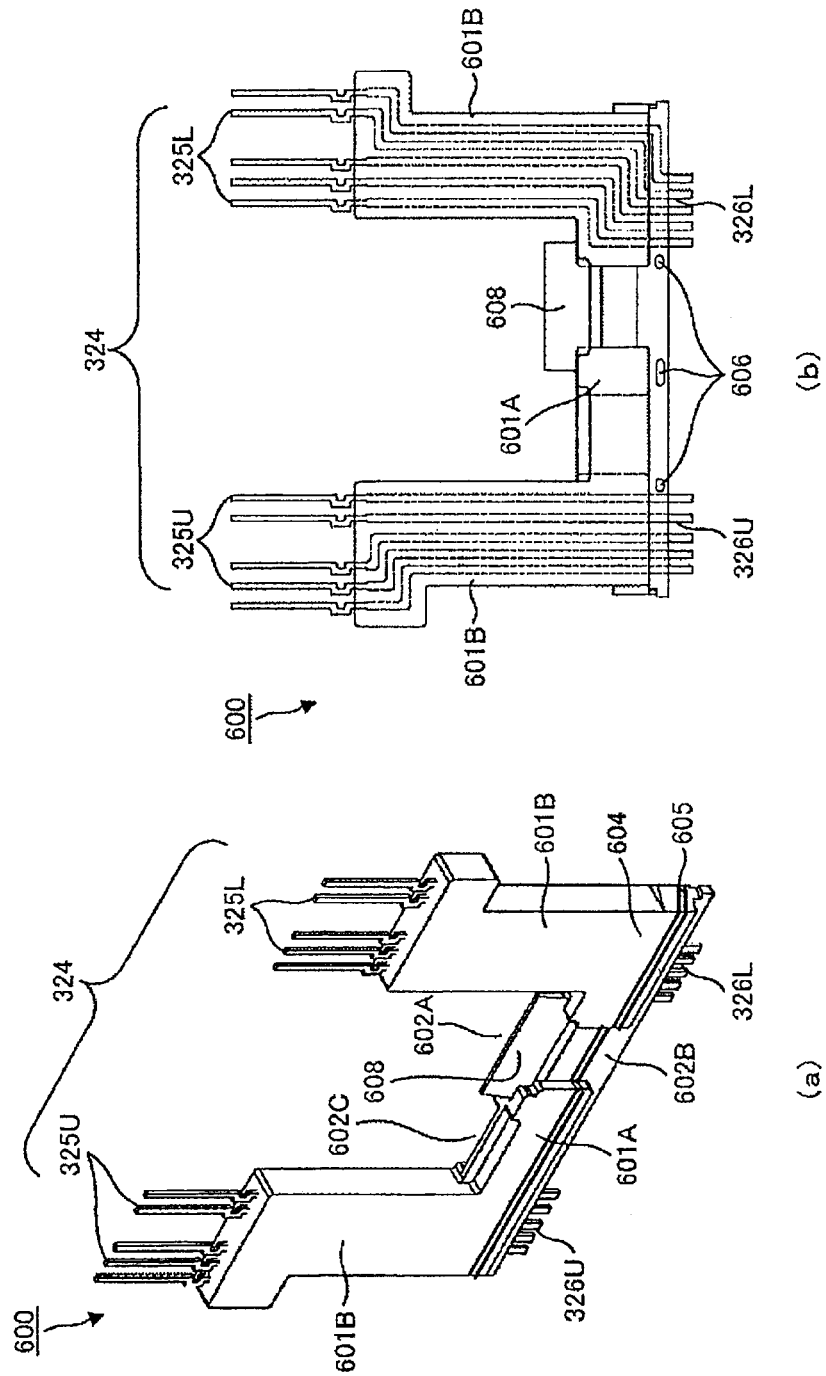
FIG. 10(a) is a perspective view of an auxiliary mold body 600.
FIG. 10(b) is a transparent diagram of the auxiliary mold body 600.

FIG. 10(a) is a perspective view of the auxiliary mold body 600. FIG. 10(b) is a transparent diagram of the auxiliary mold body 600. The auxiliary mold body 600 shown in FIG. 10 explained below have a shape different from the auxiliary mold body 600 shown in FIGS. 8 and 9. However, the auxiliary mold body 600 can be properly used according to an environment of use. For example, in order to improve vibration resistance of the signal wires 325U and 325L, the auxiliary mold body 600 shown in FIG. 10 explained below is suitable.

In the auxiliary mold body 600, a signal conductor 324 is integrated by insert molding. The signal conductor 324 includes the gate electrode terminals 154 and the emitter electrode terminals 155 on the upper arm side and the gate electrode terminals 164 and the emitter electrode terminals 165 on the upper arm side (see FIG. 2) and terminals for transmitting temperature information of the power semiconductor elements. In the explanation of this embodiment, these terminals are collectively referred to as signal terminals 325U and 325L.

In the signal conductor 324, the signal terminals 325U and 325L are formed at one end and element side signal terminals 326U and 326L are formed at the other end. The element side signal terminals 326U and 326L are connected to signal pads provided on surface electrodes of the power semiconductor elements by, for example, wires. A first sealing section 601A is formed in a shape extending in a direction traversing the long axis of the shape of the direct-current positive electrode wire 315A and the direct-current negative electrode wire 319A or the alternating-current wire 320 shown in FIG. 8(a). On the other hand, a second sealing section 601B is formed in a shape extending in a direction substantially parallel to the long axis of the shape of the direct-current positive electrode wire 315A and the direct-current negative electrode wire 319A or the alternating-current wire 320. The second sealing section 601B is formed by a sealing section for sealing the signal terminals 325U on the upper arm side and a sealing section for sealing the signal terminals 325L on the lower arm side.

The length of the auxiliary mold body 600 is formed larger than the entire length of the conductor plates 315 and 316 arranged laterally or the total length of the conductor plates 319 and 320 arranged laterally. In other words, the length of the conductor plates 315 and 316 arranged laterally or the length of the conductor plates 319 and 320 arranged laterally is within a range of the length in the lateral direction of the auxiliary mold body 600.

The first sealing section 601A forms a wire fitting section 602A formed in a hollow shape and for fitting the direct-current negative electrode wire 319A in the hollow. The first sealing section 601A forms a wire fitting section 602B formed in a hollow shape and for fitting the direct-current positive electrode wire 315A in the hollow. Further, the first sealing section 601A forms a wire fitting section 602C arranged on a side of the wire fitting section 602A, formed in a hollow shape, and for fitting the alternating-current wire 320 in the hollow. The wires are fit in these wire fitting sections 602A to 602C, whereby positioning of the wires is performed. Consequently, it is possible to perform filling work for a resin sealing material after firmly fixing the wires. As a result, mass productivity is improved.

A wire insulating section 608 projects from between the wire fitting section 602A and the wire fitting section 602B in a direction away from the first sealing section 601A. The wire insulating section 608 formed in a tabular shape is interposed between the direct-current positive electrode wire 315A and the direct-current negative electrode wire 319A. Consequently, it is possible to arrange the direct-current positive electrode wire 315A and the direct-current negative electrode wire 319A to be opposed to each other to reduce inductance while securing insulation properties.

In the first sealing section 601A, a die pressing surface 604 that comes into contact with a die used in resin sealing is formed. On the die pressing surface 604, a protruding section 605 for preventing a resin leak in the resin sealing is formed to turn around the outer periphery in the longitudinal direction of the first sealing section 601. A plurality of the protruding sections 605 are provided in order to improve a resin leak prevention effect. Further, the protruding sections 605 are provided in the wire fitting section 602A and the wire fitting section 602B as well. Therefore, it is possible to prevent the resin sealing material from leaking from the peripheries of the direct-current positive electrode wire 315A and the direct-current negative electrode wire 319A. As the material of the first sealing section 601A, the second sealing section 601B, and the protruding sections 605, when setting in a die having temperature of about 150 to 180° C. is taken into account, liquid crystal polymer of thermoplastic resin, polybutylene terephthalate (PBT), or polyphenylene sulfide resin (PPS), with which high heat resistance can be expected, is desirable.

On the power semiconductor element side in the latitudinal direction of the first sealing section 601A, a plurality of through-holes 606 shown in FIG. 10(b) are provided in a longitudinal direction. Consequently, the first sealing resin 348 flows into the through holes 606 and hardens, whereby an anchor effect develops, the auxiliary mold body 600 is firmly held by the first sealing resin 348, and the auxiliary mold body 600 and the first sealing resin 348 do not peel even if stress is applied thereto because of a temperature change or mechanical oscillation. If an uneven shape is formed instead of the through-holes, similarly, the auxiliary mold body 600 and the first sealing resin 348 do not easily peel. A certain degree of effect is obtained by applying a polyimide coat agent to the first sealing section 601A or roughening the surface of the first sealing section 601A.

In a sealing process for the first sealing resin 348 in the module primary sealing body 302, first, the auxiliary mold body 600 that supports the wires is inserted into a die preheated to about 150 to 180° C. In this embodiment, the auxiliary mold body 600, the direct-current positive electrode wire 315A, the direct-current negative electrode wire 319A, the alternating-current wire 320, the conductor plate 315, the conductor plate 316, the conductor plate 318, and the conductor plate 319 are firmly connected to one another. Therefore, the main circuits and the power semiconductor elements are set in predetermined positions by setting the auxiliary mold body 600 in a predetermined position. Therefore, productivity is improved and reliability is improved.

The second sealing section 601B is formed to be extended from the vicinity of the module case 304 to the vicinity of the driver circuit board 22. Consequently, when wiring to the driver circuit board 22 is performed avoiding power electric wires, it is possible to normally transmit a switching control signal even under a high voltage. Even if the direct-current positive electrode wire 315A, the direct-current negative electrode wire 319A, the alternating-current wire 320, the signal terminals 325U, and the signal terminals 325L project from the module case 304 in the same direction, it is possible to secure electrical insulation and secure reliability.

Figure 11:
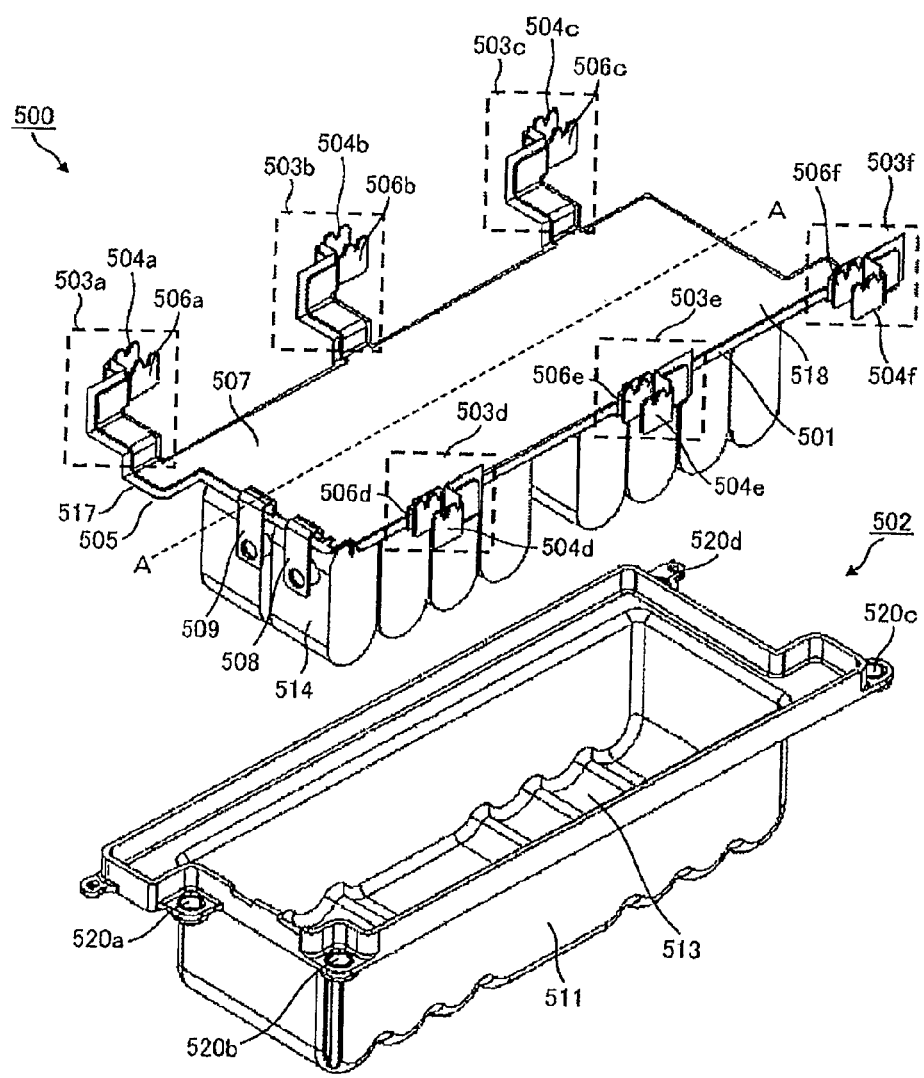
FIG. 11 is an exploded perspective view of a capacitor module 500 in the embodiment.

FIG. 11 is an exploded perspective view for explaining internal structure of the capacitor module 500. A laminated conductor plate 501 is configured by a negative electrode conductor plate 505 and a positive electrode conductor plate 507 formed by tabular wide conductors and an insulating sheet 517 held between the negative electrode conductor plate 505 and the positive electrode conductor plate 507. As explained below, the laminated conductor plate 501 offsets magnetic fluxes with respect to electric currents flowing in the series circuits 150 of the upper and lower arms of the phases. Therefore, a reduction in inductance is realized concerning the electric currents flowing in the series circuits 150 of the upper and lower arms. The laminated conductor plate 501 is formed in a substantially rectangular shape. The power supply terminal 508 on the negative electrode side and the power supply terminal 509 on the positive electrode side are formed in a state in which the power supply terminals are erected from one side in the latitudinal direction of the laminated conductor plate 501. The power supply terminal 508 and the power supply terminal 509 are respectively connected to the positive electrode conductor plate 507 and the negative electrode conductor plate 505. As explained with reference to FIG. 2, direct-current power is supplied to the power supply terminal 509 on the positive electrode side and the power supply terminal 508 on the negative electrode side via the direct-current connector 138.

Capacitor terminals 503a to 503c are formed to correspond to the positive electrode terminals 157 (315B) and the negative electrode terminals 158 (319B) of the power modules 300 in a state in which the capacitor terminals are erected from one side in the longitudinal direction of the laminated conductor plate 501. Capacitor terminals 503d to 503f are formed to correspond to the positive electrode terminals 157 (315B) and the negative electrode terminals 158 (319B) of the power modules 301 in a state in which the capacitor terminals are erected from the other side in the longitudinal direction of the laminated conductor plate 501. The capacitor terminals 503a to 503f are erected in a direction traversing the principal plane of the laminated conductor plate 501. The capacitor terminals 503a to 503c are respectively connected to the power modules 300a to 300c. The capacitor terminals 503d to 503f are respectively connected to the power modules 301a to 301c. A part of the insulating sheet 517 is provided between a negative electrode side capacitor terminal 504a and a positive electrode side capacitor terminal 506a that configure the capacitor terminal 503a and insulation is secured. The same holds true for the other capacitor terminals 503b to 503f. In this embodiment, the negative electrode conductor plate 505, the positive electrode conductor plate 507, the battery positive electrode side terminal 508, the battery negative electrode side terminal 509, and the capacitor terminals 503a to 503f are formed by integrally molded metal plates to have an effect of a reduction in inductance with respect to electric currents flowing in the series circuits 150 of the upper and lower arms.

A plurality of capacitor cells 514 are provided on the inner side of the capacitor module 500, i.e., below the laminated conductor plate 501. In this embodiment, eight capacitor cells 514 are arranged in a row along one side in the longitudinal direction of the laminated conductor plate 501 and other eight capacitor cells 514 are arranged in a row along the other side in the longitudinal direction of the laminated conductor plate 501. Sixteen capacitor cells are provided in total. The capacitor cells 514 arranged along the respective sides in the longitudinal direction of the laminated conductor plate 501 are arranged symmetrically with a broken line AA shown in FIG. 11 as a boundary. Consequently, when a direct current smoothed by the capacitor cells 514 is supplied to the power modules 300a to 300c and the power modules 301a to 301c, current balance between the capacitor terminals 503a to 503c and the capacitor terminals 503d to 503f is made uniform. It is possible to realize a reduction in inductance of the laminated conductor plate 501. Further, since an electric current can be prevented from locally flowing in the laminated conductor plate 501, heat balance is made uniform and it is also possible to improve heat resistance.

Since the large number of capacitor cells 514 are arranged in the direction along the channels, the capacitor cells 514 tend to be easily arranged uniform with respect to the series circuits 150 of the upper and lower arms of the U phase, the V phase, and the W phase of the power modules 300 and the power modules 301 arranged along the channels. There is also an effect that the capacitor cells 514 can be uniformly cooled by the coolant. Since current balance between the capacitor terminals 503a to 503c and the capacitor terminals 503d to 503f is made uniform, it is possible to realize a reduction in inductance of the laminated conductor plate 501. Further, since heat balance is made uniform, it is also possible to improve heat resistance.

The capacitor cell 514 is a unit structure of an electricity accumulating section of the capacitor module 500. A film capacitor in which two films deposited with metal such as aluminum on one side are laminated and wound around and respectively set as a positive electrode and a negative electrode is used as the capacitor cell 514. Wound axis surfaces of the electrodes of the capacitor cells 514 are respectively positive and negative electrodes. The electrodes are manufactured by spraying a conductor such as tin.

The capacitor case 502 includes a housing section 511 for housing the capacitor cell 514. The upper surface and the lower surface of the housing section 511 shown in the figure are formed in a substantially rectangular shape. In the capacitor case 502, fixing means for fixing the capacitor module 500 to the channel forming body 12, for example, holes 520a to 520d for causing screws to pierce through are provided. A bottom surface section 513 of the housing section 511 is formed in a smooth uneven shape or a wavy shape to match the surface shape of the cylindrical capacitor cell 514. Consequently, it is possible to position, in the capacitor case 502, the modules to which the laminated conductor plate 501 and the capacitor cell 514 are connected. After the laminated conductor plate 501 and the capacitor cells 514 are housed in the capacitor case 502, a filler (not shown in the figure) is filled in the capacitor case 502 to cover the laminated conductor plate 501 excluding the capacitor terminals 503a to 503f and the power supply terminal 508 on the negative electrode side and the power supply terminal 509 on the positive electrode side. Since the bottom surface section 513 is formed in the wavy shape to match the shape of the capacitor cell 514, when the filler is filled in the capacitor case 502, it is possible to prevent the capacitor cell 514 from deviating from a predetermined position.

The capacitor cell 514 generates heat with electric resistance of a metal thin film deposited on the films on the inside and the inner conductors caused by a ripple current during switching. Therefore, in order to allow the heat of the capacitor cell 514 to easily escape via the capacitor case 502, the capacitor cell 514 is molded with the filler. Further, it is also possible to improve humidity resistance of the capacitor cell 514 by using a filler made of resin. In this embodiment, since the channels are provided along the longitudinal direction of the housing section 511 of the capacitor module 500, cooling efficiency is improved. Further, in this embodiment, in the capacitor module 500, the sidewall forming the side in the longitudinal direction of the housing section 511 is arranged to be held by the channels 19. Therefore, it is possible to efficiently cool the capacitor module 500. In the capacitor cell 514, one of the electrode surfaces of the capacitor cell 514 is arranged to be opposed to the inner wall forming the side in the longitudinal direction of the housing section 511. Consequently, since heat is easily transmitted in the direction of the winding axis of the films, the heat easily escapes to the capacitor case 502 via the electrode surface of the capacitor cell 514.

Figure 2:
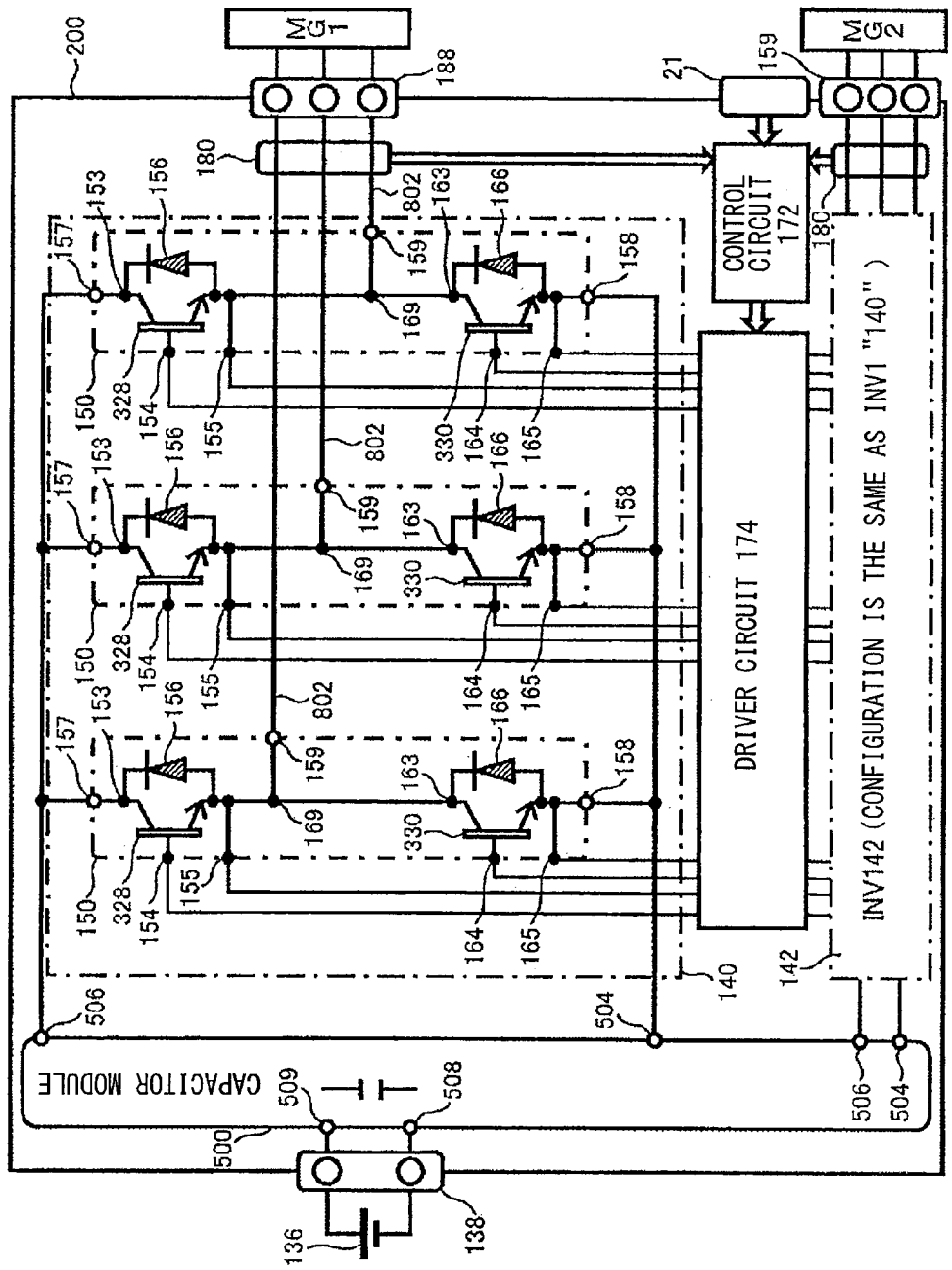
FIG. 2 is a control configuration diagram and a circuit configuration diagram applied to the hybrid automobile.
Figure 12:
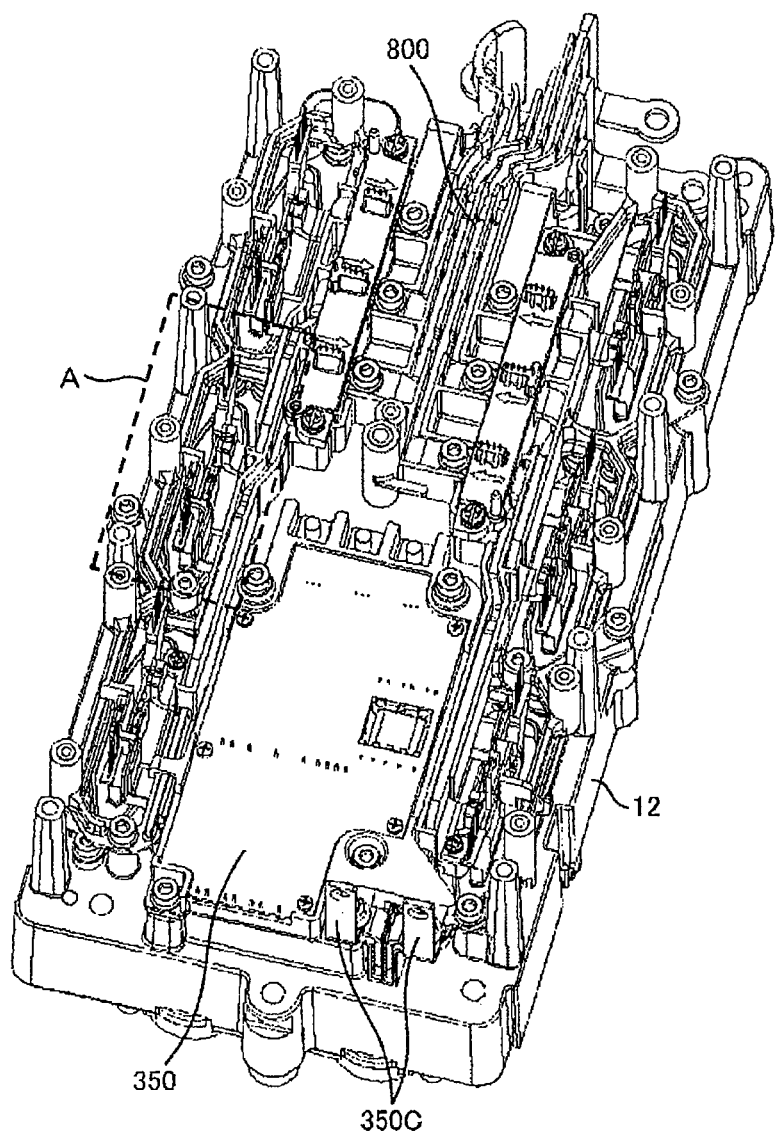
FIG. 12 is an external perspective view in which a power module 300, the capacitor module 500, and a bus bar assembly 800 are assembled to a channel forming body 12.
Figure 13:
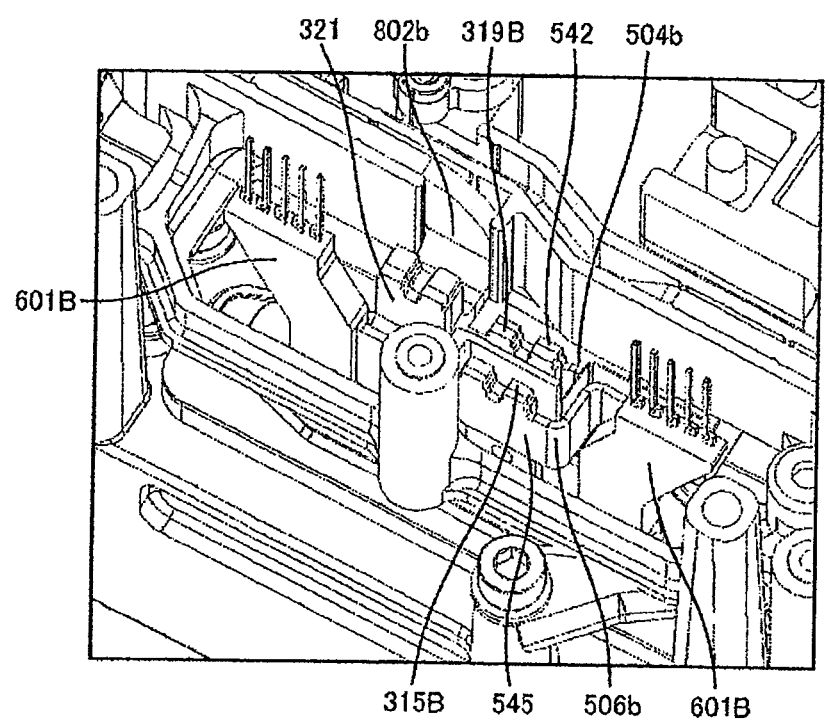
FIG. 13 is an enlarged diagram of a portion A shown in FIG. 12.

In the following explanation, the direct-current negative electrode terminal 315B and the positive electrode terminal 157 shown in FIG. 2 are the same. The direct-current positive electrode terminal 319B and the negative electrode terminal 158 shown in FIG. 2 are the same. FIG. 12 is an external perspective view of the power module 300, the capacitor module 500, and the bus bar assembly 800 assembled to the channel forming body 12. FIG. 13 is an enlarged diagram of a portion A shown in FIG. 12. In FIGS. 12 and 13, the direct-current negative electrode terminal 315B (157), the direct current positive-electrode terminal 319B (158), the alternating-current terminal 321 (159), and the second sealing section 601B extend in the longitudinal direction of the housing 10 to the lid side. The area of current paths of the direct-current negative electrode terminal 315B (157) and the direct-current positive electrode terminal 319B (158) is extremely smaller than the area of a current path of the laminated conductor plate 501. Therefore, when an electric current flows from the laminated conductor plate 501 to the direct-current negative electrode terminal 315B (157) and the direct-current positive electrode terminal 319B (158), the area of the current paths substantially changes. In other words, the electric current is concentrated on the direct-current negative electrode terminal 315B (157) and the direct-current positive electrode terminal 319B (158). When the direct-current negative electrode terminal 315B (157) and the direct-current positive electrode terminal 319B (158) project in a direction traversing the laminated conductor plate 501, in other words, the direct-current negative electrode terminal 315B (157) and the direct-current positive electrode terminal 319B (158) are in a twisting relation with the laminated conductor plate 501, a new conductor connection is necessary. Therefore, it is likely that productivity is deteriorated and costs increase.

In this embodiment, the negative electrode side capacitor terminal 504a (in FIG. 13, 504b) includes an erected section erected from the laminated conductor plate 501 and includes a connecting section 542 at the distal end of the erected section. The positive electrode side capacitor terminal 506a (in FIG. 13, 506b) includes an erected section erected from the laminated conductor plate 501 and includes a connecting section 545 at the distal end of the erected section. The direct-current positive electrode terminal 319B (158) and the direct-current negative electrode terminal 315B (157) of the power module 300 are connected to be held between the connecting section 542 and the connecting section 545. Consequently, the capacitor terminals 504a and 506a form laminated structures via the insulating sheet to immediately before the connecting sections 542 and 545. Therefore, it is possible to reduce the inductance of wiring portions of the capacitor terminals 504a and 506a on which an electric current is concentrated. Further, the distal end of the direct-current positive electrode terminal 319B (158) and the side of the connecting section 542 are connected by welding. Similarly, the distal end of the direct-current negative electrode terminal 315B (157) and the side of the connecting section 545 are connected by welding. Therefore, it is possible to improve productivity in addition to improvement of characteristics by a reduction in inductance.

The distal end of the alternating-current terminal 321 (159) of the power module 300 is connected to the distal end of an alternating-current bus bar 802a (in FIG. 13, 802b) by welding. In a manufacturing facility for the welding, manufacturing a welding machine to be capable of moving in a plurality of directions with respect to a welding object leads to complication of the manufacturing facility. This is undesirable from the viewpoint of productivity and costs. Therefore, in this embodiment, a welding place of the alternating-current terminal 321 (159) and a welding place of the direct-current positive electrode terminal 319B (158) are linearly arranged along the side in the longitudinal direction of the channel forming body 12. Consequently, it is possible to perform a plurality of kinds of welding while the welding machine is moved in one direction. Therefore, productivity is improved.

Further, as shown in FIGS. 4 and 12, the plurality of power modules 300a to 300c are linearly arranged along the side in the longitudinal direction of the channel forming body 12. Consequently, when the plurality of power modules 300a to 300c are welded, it is possible to further improve productivity.

Figure 14:
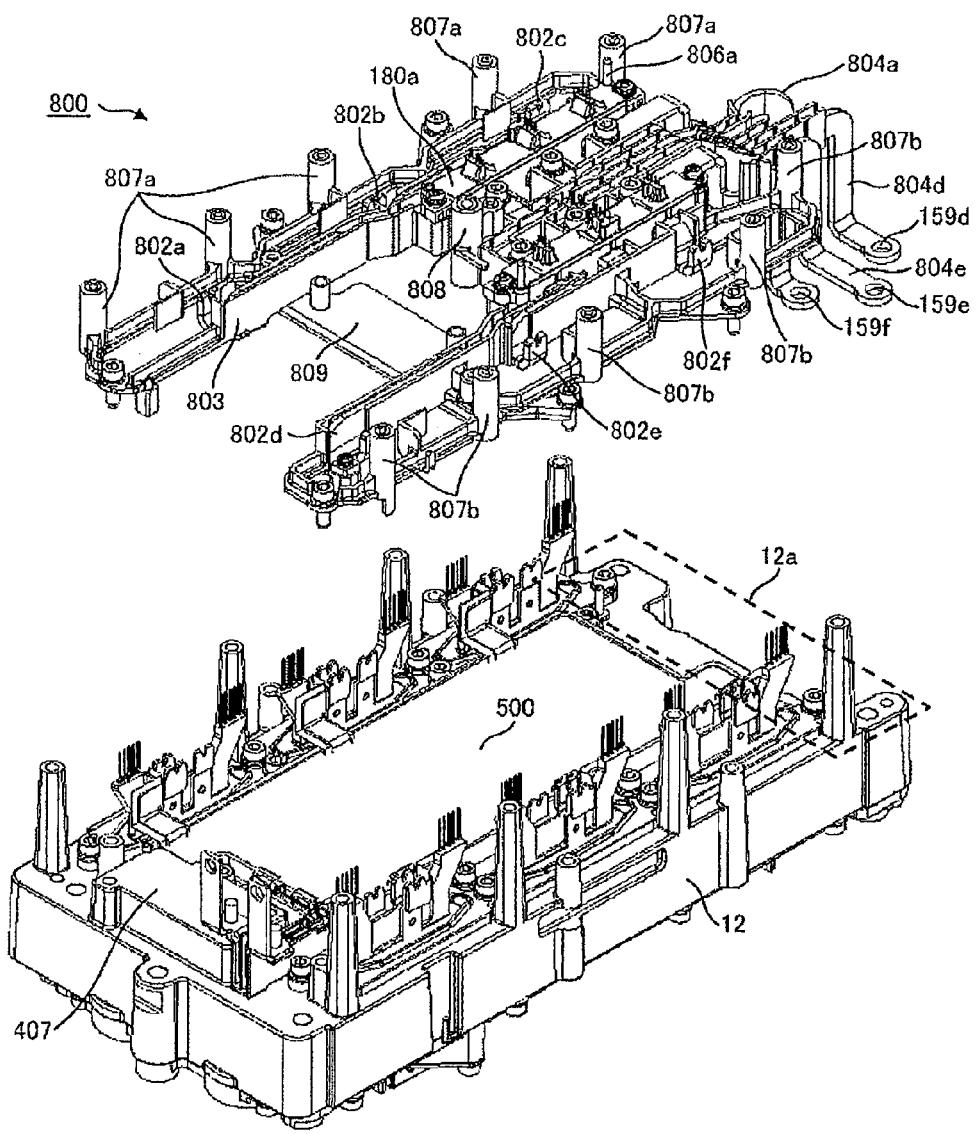
FIG. 14 is an exploded perspective view of the channel forming body 12 to which the power module 300 and the capacitor module 500 are assembled and the bus bar assembly 800.
Figure 15:
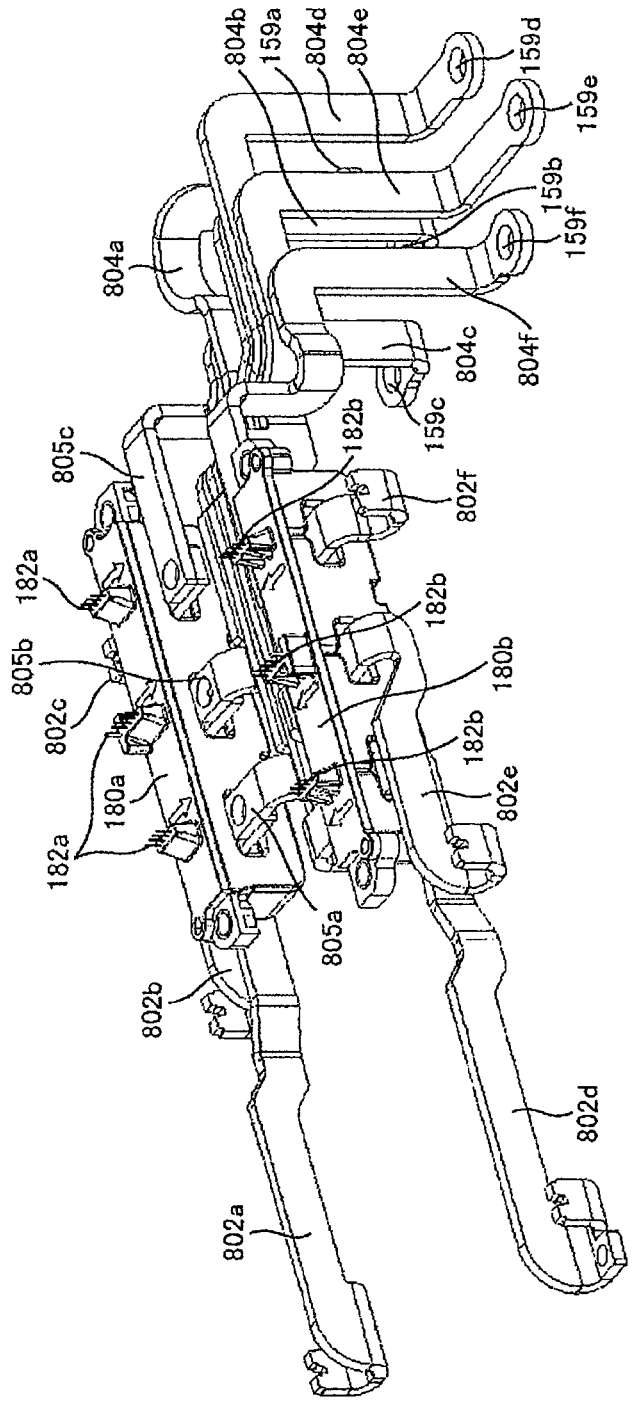
FIG. 15 is an external perspective view of the bus bar assembly 800 from which a holding member 803 is removed.

FIG. 14 is an exploded perspective view of the channel forming body 12 and the bus bar assembly 800 to which the power module 300 and the capacitor module 500 are assembled. FIG. 15 is an external perspective view of the bus bar assembly 800 from which the holding member 803 is removed. In FIGS. 14 and 15, the bas bur assembly 800 includes a holding member 803 for holding and fixing first and second alternating-current bus bars respectively arranged on both sides and first alternating-current bus bars 802a to 802f and second alternating-current bus bars 804a to 804f provided on both the sides. In the bus bar assembly 800, current sensors 180 for detecting alternating currents flowing through the first and second alternating-current bus bars 802 and 804 provided on both the sides are provided. The first and second alternating-current bus bars 802 and 804 provided on both the sides are respectively formed by wide conductors. The first alternating-current bus bars 802a to 802f are arranged to a setting place of an electric sensor 180a or an electric sensor 180b such that wide surfaces of the first alternating-current bus bars 802a to 802f are substantially perpendicular to the principal plane of the laminated conductor plate 501 of the capacitor module 500. The first alternating-current bus bars 802a to 802f are bent substantially at a right angle before a through-hole of the current sensor 180a or 180b. The wide surfaces of the alternating-current bus bars are substantially parallel to the principal plane of the laminated conductor plate 501. After piercing through the hole of the current sensor 180a or the current sensor 180b, the first alternating-current bus bars 802a to 802f are connected to the second alternating-current bus bars 804a to 804f. Most of the second alternating-current bus bars 804a to 804f are formed in a state in which wide surfaces thereof are substantially perpendicular to the principal plane of the laminated conductor plate 501 of the capacitor module 500, i.e., a state in which narrow surfaces of the alternating-current bus bars face the longitudinal direction of the power converting device. As shown in FIG. 15, after piercing through the hole of the current sensor 180a or the current sensor 180b, the first alternating-current bus bars 802a to 802f are connected to the second alternating-current bus bars 804a to 804f in connecting sections 805a to 805f (the connecting sections 805d to 805f are not shown in the figure) formed in the first alternating-current bus bars 802a to 802f.

As explained above, the second alternating-current bus bars 804a to 804f are bent at a substantially right angle in the vicinities of the connecting sections 805a to 805f toward the capacitor module 500 side. Consequently, the principal planes of the second alternating-current bus bars 804a to 804f are formed to be substantially perpendicular to the principal plane of the laminated conductor plate 501 of the capacitor module 500. Further, as shown in FIGS. 12, 14, and 15, the second alternating-current bus bars 804a to 804f are extended from the vicinities of the current sensor 180a or the current sensor 180b to one side 12a in the latitudinal direction of the channel forming body 12 and formed to traverse the side 12a. In other words, the second alternating-current bus bars 804a to 804f are formed to traverse the side 12a in a state in which the principal planes of the plurality of second alternating-current bus bars 804a to 804f are opposed to one another.

The alternating-current bus bars 802a, 802b, 802d, and 802e are arranged on both the sides along the channels arranged on both the sides on the inner side of the housing 10, whereby an increase in the size of the entire device can be reduced. Since the narrow surfaces of the wide conductors are aligned to be arranged to face the longitudinal direction of the device. Therefore, it is possible to reduce a space occupied by the first alternating-current bus bar 802 and the second alternating-current bus bar 804 and reduce an increase in the size of the entire device. Further, the plurality of alternating-current bus bars are projected from one surface side of the channel forming body 12. Therefore, a wire is easily handled on the outside of the power converting device 200 and productivity is improved.

As shown in FIG. 14, the first alternating-current bus bars 802a to 802f, the current sensors 180a and 180b, and the second alternating-current bus bars 804a to 804f are held and insulated by the holding member 803 formed of resin. Insulation between the second alternating-current bus bars 804a to 804f and the channel forming body 12 and the housing 10 made of metal is improved by this holding member 803.

The bus bar assembly 800 is structured to be fixed to the channel forming body 12 by the holding member 803. Even if heat is transmitted to the housing 10 from the outside, a temperature rise in the channel forming body 12 in which the channels for the cooling medium are formed is suppressed. The bus bar assembly 800 is fixed to this channel forming body 12, whereby it is possible to not only suppress a temperature rise of the bus bar assembly 800 but also suppress a temperature rise of the current sensors 180 held by the bus bar assembly 800. The current sensors 180 have a characteristic that the current sensors 180 are weak to heat. The reliability of the current sensors 180a to 180b can be improved by the structure. Further, as in this embodiment, when the power converting device is fixed to the transmission, heat is transmitted to the housing 10 from the transmission TM side and heat is also transmitted from the motor generator side via the second alternating-current bus bars 804a to 804f. These kinds of heat can be blocked by the channel forming body 12 and allowed to escape to the coolant. Therefore, it is possible to suppress a temperature rise of the current sensors 180*a* to 180*b* and improve reliability.

As shown in FIG. 14, the holding member 803 includes supporting members 807*a* and supporting members 807*b* for supporting the driver circuit board 22 shown in FIG. 4. A plurality of the supporting members 807*a* are provided and formed along one side in the longitudinal direction of the channel forming body 12. A plurality of the supporting members 807*b* are provided and formed side by side along the other side in the longitudinal direction of the channel forming body 12. Screw holes for fixing the driver circuit board 22 are formed at the distal ends of the supporting members 807*a* and the sporting members 807*b*.

Further, the holding member 803 includes a protruding section 806*a* and a protruding section 806*b* extending upward from places where the current sensor 180*a* and the current sensor 180*b* are arranged. The protruding section 806*a* and the protruding section 806*b* are configured to respectively pierce through the current sensor 180*a* and the current sensor 180*b*. As shown in FIG. 15, the current sensor 180*a* and the current sensor 180*b* include a signal line 182*a* and a signal line 182*b* extending in the arrangement direction of the driver circuit board 22. The signal line 182*a* and the signal line 182*b* are joined to a wiring pattern of the driver circuit board 22 by solder. In this embodiment, the holding member 803, the supporting members 807*a* to 807*b*, and the protruding sections 806*a* to 806*b* are integrally formed with resin.

Consequently, the holding member 803 includes a function of positioning the current sensors 180 and the driver circuit board 22. Therefore, assembly and solder connecting work between the signal line 182*a* and the driver circuit board 22 is easily performed. A mechanism for holding the current sensors 180 and the driver circuit board 22 is provided in the holding member 803, whereby it is possible to reduce the number of components of the power converting device as a whole.

In this embodiment, since the power converting device 200 is fixed to the housing 10 provided in the transmission TM, the power converting device 200 is substantially affected by oscillation from the transmission TM. Therefore, a supporting member 808 for supporting the vicinity of the center of the driver circuit board 22 is provided in the holding member 803 to reduce the influence of oscillation applied to the driver circuit board 22. For example, the center of the driver circuit board 22 is supported by the supporting member 808, whereby it is possible to set the resonant frequency of the driver circuit board 22 higher than the frequency of oscillation transmitted from the transmission TM and reduce the influence of oscillation of the transmission TM applied to the driver circuit board 22. The holding member 803 of the bus bar assembly 800 is fixed to the channel forming body 12 by screws.

In the holding member 803, a bracket 809 for fixing one end of the auxiliary machine power module 350 is provided. As shown in FIG. 4, the auxiliary machine power module 350 is arranged in the cooling section 407, whereby the other end of the auxiliary machine power module 350 is fixed to the cooling section 407. Consequently, it is possible to reduce the influence of oscillation applied to the auxiliary machine power module 350 and reduce the number of components for the fixing.

Figure 16:
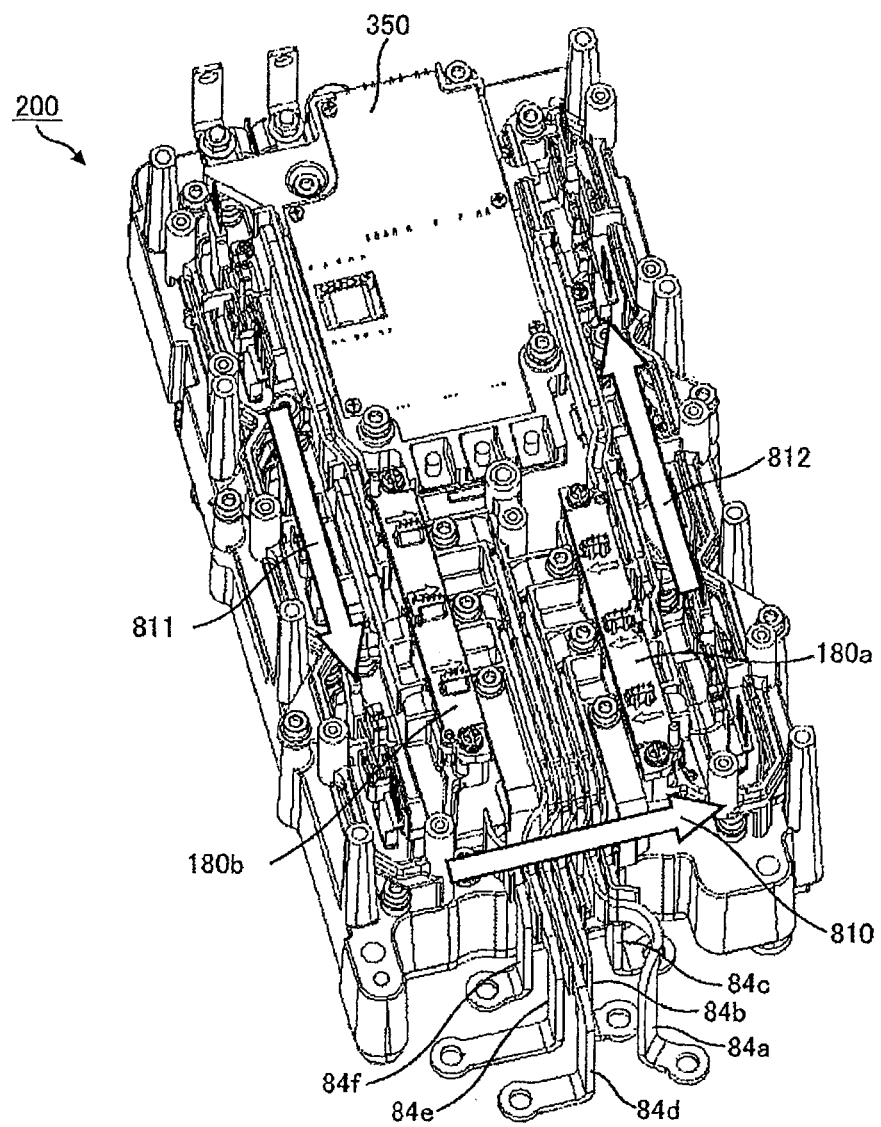
FIG. 16 is an external perspective view of a state in which the power module, the capacitor module, the bus bar assembly 800, and an auxiliary machine power module 350 are assembled to the channel forming body 12.

FIG. 16 is an external perspective view of a state in which the power modules, the capacitor module, the bus bar assembly 800, and the auxiliary machine power module 350 are assembled to the channel forming body 12. The current sensors 180 sometimes cannot be used as sensors at temperature equal to or higher than about 100° C. An environment of use of a vehicle-mounted power converting device is extremely intense and temperature rises. It is one of important objects to protect the current sensors 180 from heat. In particular, the power converting device 200 is mounted on the transmission TM. Therefore, it is an important object to protect the current sensors 180 from the influence of heat generated from the transmission TM.

Therefore, in this embodiment, the current sensor 180*a* and the current sensor 180*b* are arranged on the opposite side of the transmission TM across the channel forming body 12. Consequently, heat generated by the transmission TM is less easily transmitted to the current sensors and a temperature rise of the current sensors can be suppressed. Further, the second alternating-current bus bars 804*a* to 804*f* are formed to traverse the third channel section 19*c* shown in FIG. 5. The current sensor 180*a* and the current sensor 180*b* are arranged on a side closer to the alternating-current terminals 321 (159) of the power modules than the portions of the second alternating-current bus bars 804*a* to 804*f* traversing the third channel section 19*c*. Consequently, the second alternating-current bus bars 804*a* to 804*f* are indirectly cooled by the coolant. It is possible to ease the heat transmitted from the alternating-current bus bars to the current sensors and to the semiconductor chips in the power modules. Therefore, reliability is improved.

A flowing direction 810 shown in FIG. 16 indicates a flowing direction of the coolant flowing through the third channel 19*c* shown in FIG. 5. A flowing direction 811 indicates a flowing direction of the coolant flowing through the fourth channel 19*d* shown in FIG. 5. Similarly, a flowing direction 812 indicates a flowing direction of the coolant flowing through the second channel 19*b* shown in FIG. 5. In this embodiment, the current sensor 180*a* and the current sensor 180*b* are arranged such that, when projected from above the power converting device 200, projected portions of the current sensor 180*a* and the current sensor 180*b* are surrounded by projected portions of the channels 19. Consequently, it is possible to further protect the current sensors from the heat of the transmission TM.

Figure 17:
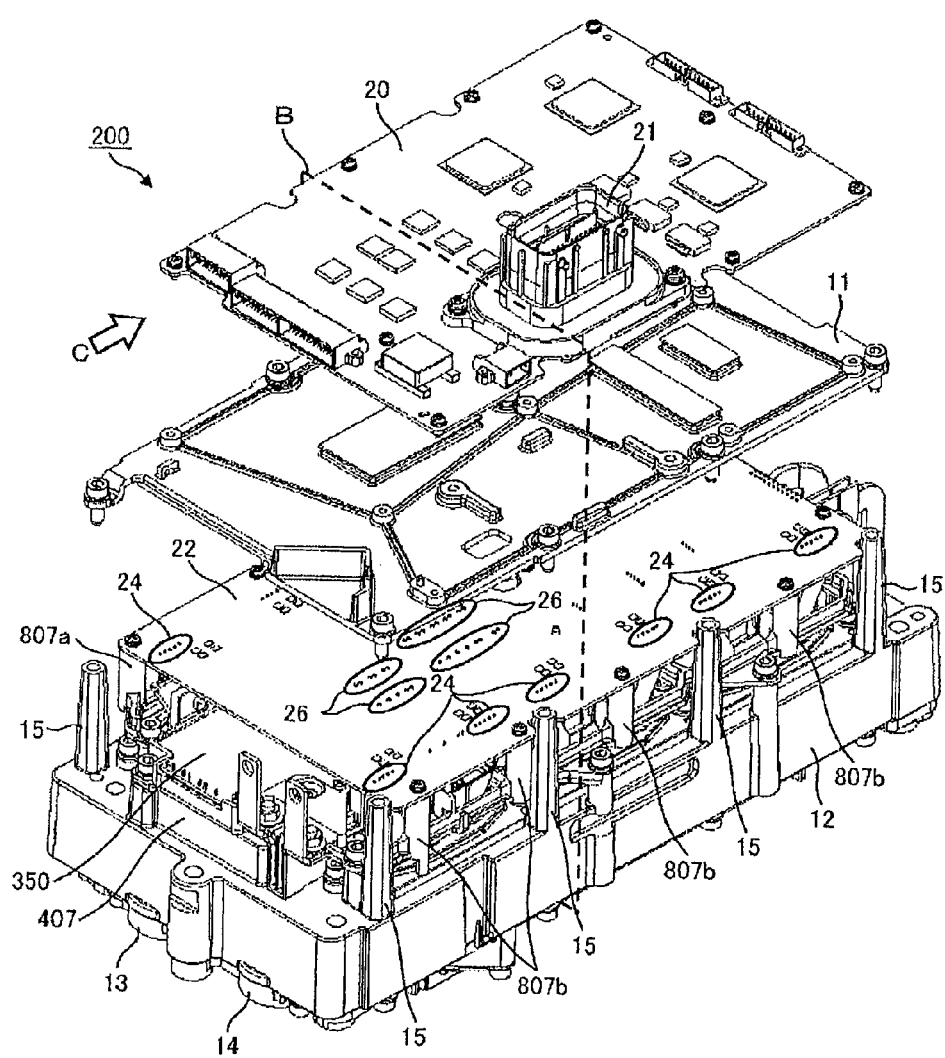
FIG. 17 is a perspective view of a state in which a control circuit board 20 and a metal base plate 11 are separate to assist understanding.

FIG. 17 is a perspective view of a state in which the control circuit board 20 and the metal base plate 11 are separated to assist understanding. As shown in FIG. 16, the current sensors 180 are arranged above the capacitor module 500. The driver circuit board 22 is arranged above the current sensors 180 shown in FIG. 16 and supported by supporting members 807*a* and 807*b* provided in the bus bar assembly 800 shown in FIG. 14. The metal base plate 11 is arranged above the driver circuit board 22. In this embodiment, the metal base plate is supported by a plurality of supporting members 15 vertically provided from the channel forming body 12. The control circuit board 20 is arranged above the metal base plate 11 and fixed to the metal base plate 11.

The current sensors 180, the driver circuit board 22, and the control circuit board 20 are arranged in layers in the height direction. The control circuit board 20 is arranged in a place most distant from the power modules 300 and 301 of the power electrics system. Therefore, it is possible to suppress contamination by switching noise and the like. Further, the metal base plate 11 is electrically connected to the channel forming body 12 electrically connected to the ground. Noise contaminating the control circuit board 20 from the driver circuit board 22 is reduced by this metal base plate 11.

When the current sensors 180 and the driver circuit board 22 are electrically connected, it is desirable to prevent complication of a connection process and a connection mistake that occur when a wiring connector is used. In FIG. 17, first holes 24 and second holes 26 piercing through the driver circuit board 22 are formed in the driver circuit board 22. The signal terminals 325U and the signal terminals 325L of the power module 300 are inserted into the first holes 24. The signal terminals 325U and the signal terminals 325L are joined to the wiring pattern of the driver circuit board 22 by solder. The signal lines 182 of the current sensors 180 are inserted into the second holes 26. The signal lines 182 are joined to the wiring pattern of the driver circuit board 22 by solder. The solder joining is performed from a surface side of the driver circuit board 22 on the opposite side of a surface opposed to the channel forming body 12.

Consequently, the signal lines can be connected without using the wiring connector. Therefore, it is possible to improve productivity. The signal terminals 325 of the power module 300 and the signal lines 182 of the current sensors 180 are joined by solder from the same direction, whereby it is possible to further improve productivity. Further, it is possible to reduce a risk of a connection mistake by providing, in the driver circuit board 22, the first holes 24 through which the signal terminals 325 pierce and the second holes 26 through which the signal lines 182 pierce.

The driver circuit board 22 according to this embodiment is mounted with a driving circuit (not shown) such as a driver IC chip on a surface side opposed to the channel forming body 12. Consequently, the heat of the solder joining is suppressed from being transmitted to the driver IC chip and the like to prevent damage to the driver IC chip and the like due to the solder joining. A tall component such as a transformer mounted on the driver circuit board 22 is arranged in a space between the capacitor module 500 and the driver circuit board 22. Therefore, it is possible to reduce the height of the entire power converting device 200.

In this embodiment, the power modules 300 and 301 inserted and fixed in the channels 19 are cooled and the capacitor module 500 is cooled by the coolant flowing through the channels 19. It is desirable that the auxiliary machine power module 350 is also cooled in order to suppress a temperature rise due to the heat generation of the auxiliary machine power module 350 with the coolant flowing through the channels 19. Since portions that can be cooled are limited in the housing 10, a cooling method and a cooling structure need to be contrived.

Figure 19:
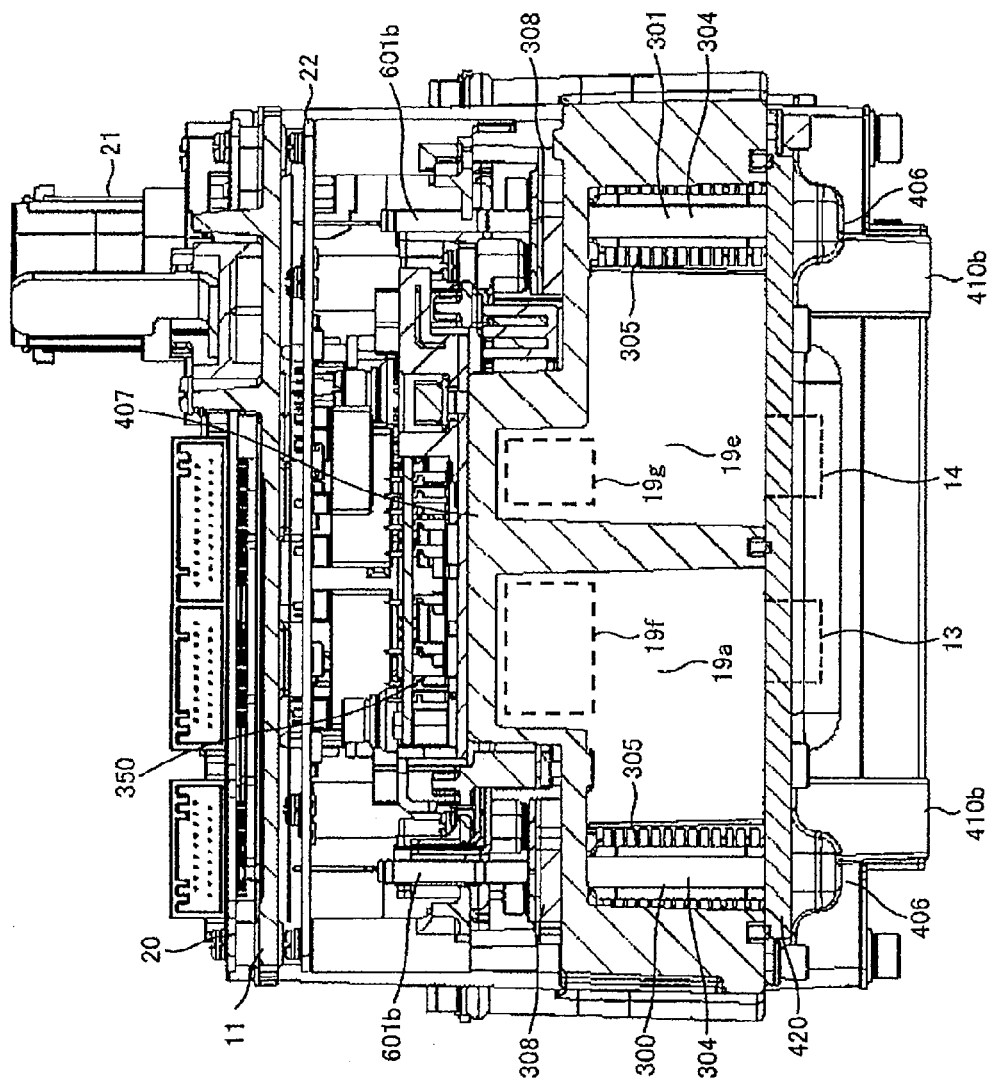
FIG. 19 is a sectional view of the power converting device 200 taken along an inlet pipe 13 and an outlet pipe 14 shown in FIG. 17.

Therefore, in this embodiment, a heat radiation surface formed by a metal base of the auxiliary machine power module 350 is arranged to be opposed to the cooling section 407 shown in FIG. 4. The cooling section 407 shown in FIG. 4 is provided to cool the auxiliary machine power module 350. The rear side of the cooling section 407 is shown in FIG. 5. A sectional view in the portion of the cooling section 407 is shown in FIG. 19. In FIGS. 4, 5, and 19, the auxiliary machine power module 350 is fixed such that the heat radiation surface thereof is in contact with the outer peripheral surface of the cooling section 407. Since the cooling section 407 is formed above the inlet pipe 13, the coolant flowing into the cooling section 407 from the lower side can collide against the inner wall of the cooling section 407 and efficiently deprive heat from the auxiliary machine power module 350. The coolant flowing into the cooling section 407 from the inlet pipe 13 indicated by a broken line in FIG. 19 collides against the upper surface of a coolant pool 19f formed on the inside of the cooling section 407 and the direction of the flow is changed. At this point, the coolant deprives the heat of the cooling section 407. The coolant, the direction of the flow of which is changed, flows into the channel 19b shown in FIGS. 4 and 5 from the channel 19a and cools the power modules 300 and 301. The coolant having cooled the power module 301 flows into the channel 19e. The coolant is discharged from the outlet pipe 14 indicated by a broken line. A coolant pool 19g is formed in an upper part of the channel 19e. The cooling section 407 is cooled by the coolant in the coolant pool 19g. In order to set the fluid resistance of the channels in an appropriate state, the coolant pool 19f on the inflow side is set larger than the coolant pool 19g on the outlet side. With such structure, it is possible to efficiently cool the auxiliary machine power module 350.

Figure 18:
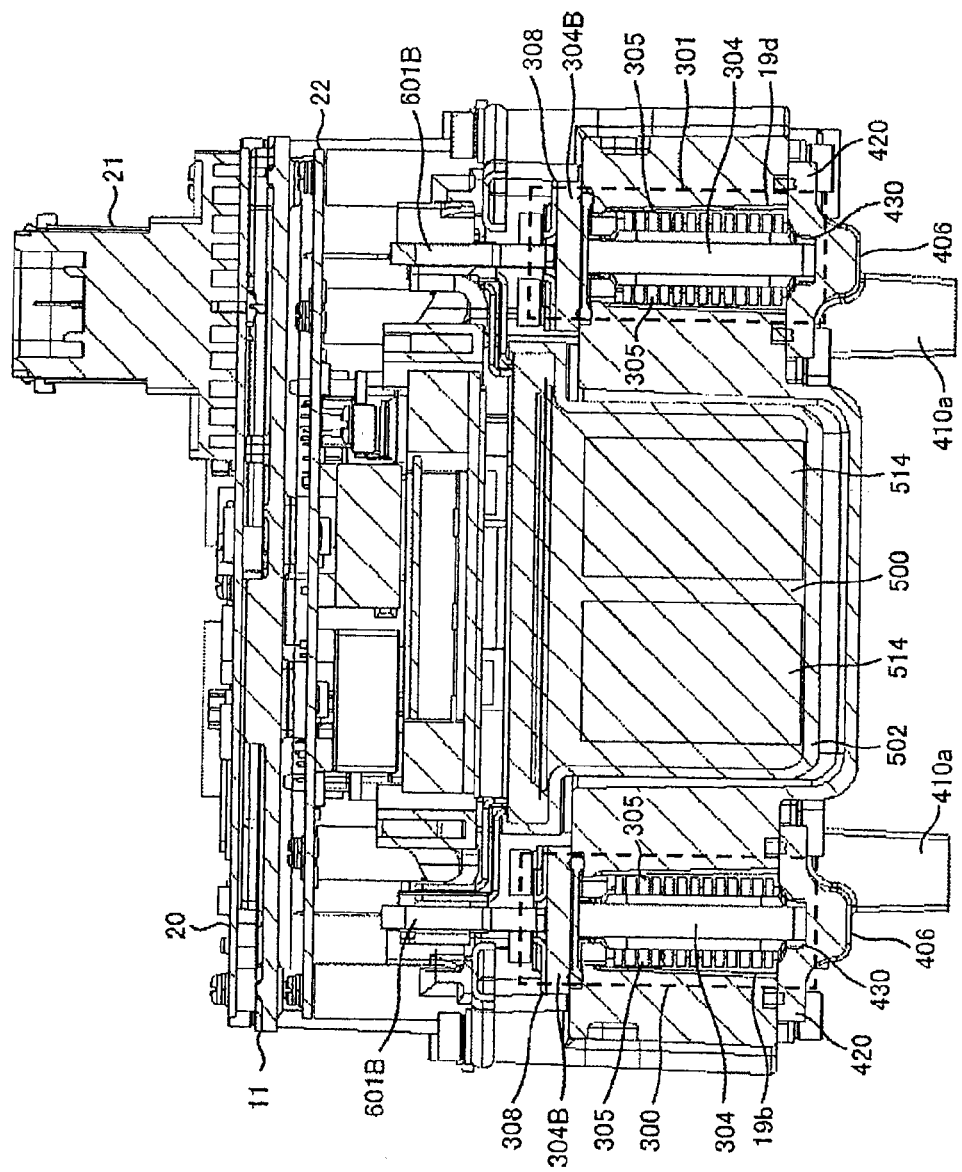
FIG. 18 is a sectional view of the power converting device 200 viewed from a C direction on a surface indicated by a broken line B shown in FIG. 17.

FIG. 18 is a sectional view of the power converting device 200 viewed from a C direction on a surface indicated by a broken line B shown in FIG. 17. The flange 304B provided in the module case 304 is pressed against the openings of the channels of the channel forming body 12. It is possible to improve the air tightness of the channels 19 by pressing the module case 304 against the channel forming body 12. In order to improve the cooling efficiency of the power module 300, it is necessary to feed the coolant in the channels 19 to a region where the fins 305 are formed. In order to secure a space of the thin sections 304A in the module case 304, the fins 305 are not formed in a lower part of the module case 304. Therefore, the lower cover 420 is formed such that the lower part of the module case 304 is fit in a concave section 430 formed in the lower cover 420. Consequently, it is possible to prevent the coolant from flowing into the space in which the cooling fins are not formed.

Figure 20:
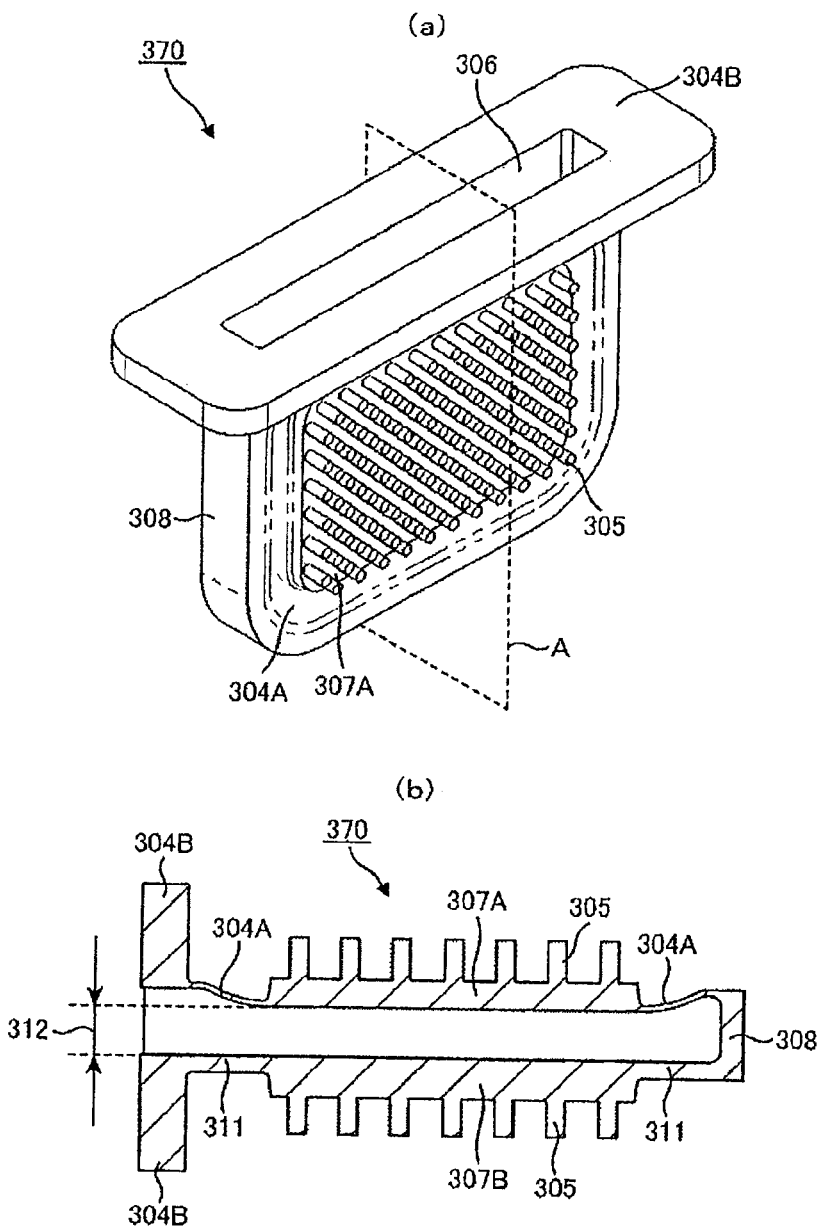
FIG. 20(a) is a perspective view of a module case 370 according to a second embodiment.
FIG. 20(b) is a sectional view of the module case 370 viewed from a cross section A of FIG. 20(a)

FIG. 20(a) is a perspective view of the module case 370 according to a second embodiment. FIG. 20(b) is a sectional view of the module case 370 viewed from a cross section A of FIG. 20(a). Components denoted by reference numerals and signs same as those in the embodiment explained above (FIG. 8(b)) have functions same as those of the components in the embodiment.

The thin section 304A is formed surrounding the first heat radiator 307A and formed extremely thinner than the first radiator 307A, the flange section 304B, and the frame body 308. Therefore, only the thin section 304A can be locally elastically deformed. On the other hand, a fixed member 311 formed surrounding the second radiator 307B is formed thicker than the thin section 304A. The thin section 304A functions as an intermediate member that connects the first radiator 307A and the frame body 308. The fixed member 311 functions as an intermediate member that connects the second radiator 307B and the frame body 308. The fixed member 311 is formed to be flush with the inner wall surface of the second radiator 307B.

Figure 21:
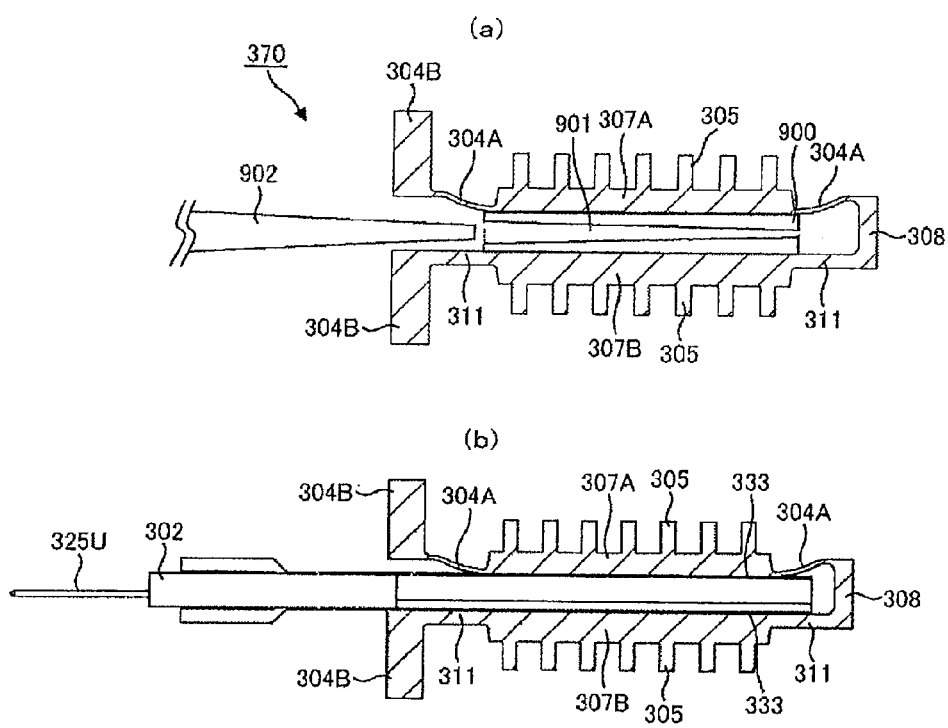
FIG. 21 is a process chart showing a process for inserting the module primary sealing body 302 into the module case 370.

FIGS. 21(a) and 21(b) are process charts showing a process for inserting the module primary sealing body 302 into the module case 370. An inter-inner wall distance 312 is formed to be smaller than the thickness 303 of the module primary sealing body 302 shown in FIG. 8(a).

A step shown in FIG. 21(a) is the same as the step shown in FIG. 9(a). However, only the thin section 304A is elastically deformed by the jig 902 and the fixed member 311 is not deformed. As shown in FIG. 21(b), the jig 900 and the jig 902 are removed from the module case 304. The pressurizing force for elastically deforming the thin section 304A is released. When the pressurizing force is released, elastic force to return to the inter-inner wall distance 309 of the module case 304 acts on the elastically-deformed thin section 304A. The module primary sealing body 302 is supported and fixed by a cooling body that forms the first radiator 307A and the second radiator 307B. The module primary sealing body 302 is supported and fixed by elastic force from the thin section 304A on the upper surface side and the fixed member 311 that retains the elastic force.

When the signal terminals 325U and 325L of the power module 300 and the driver circuit board 22 are connected, positioning of the module primary sealing body 302 and the module case 370 is important. For improvement of productivity, the module primary sealing body 302 and the module case 370 are required to be highly accurately assembled. Therefore, if the module case 370 in this embodiment is used, the effect of absorbing dimensional fluctuation due to the transition of the first radiator 307A and the second radiator 307B is reduced. However, a ground surface of the fixed member 311 and the second radiator 307B serves as a reference surface, whereby the module primary sealing body 302 can be mounted on the module case 370 with higher positioning accuracy.

In the example explained in this embodiment, the thin section 304A is elastically deformed. However, the inter-inner wall distance 309 and the thickness of the thin section 304A of the module case 304 may be set such that the thin section 304A is plastically deformed when the module primary sealing body 302 is inserted into the module case 304. When the thin section 304A is plastically deformed, it is more desirable to improve joining force of the module case 304 and the module primary sealing body 302 by imparting adhesiveness to the insulating sheet 333.

Figure 22:
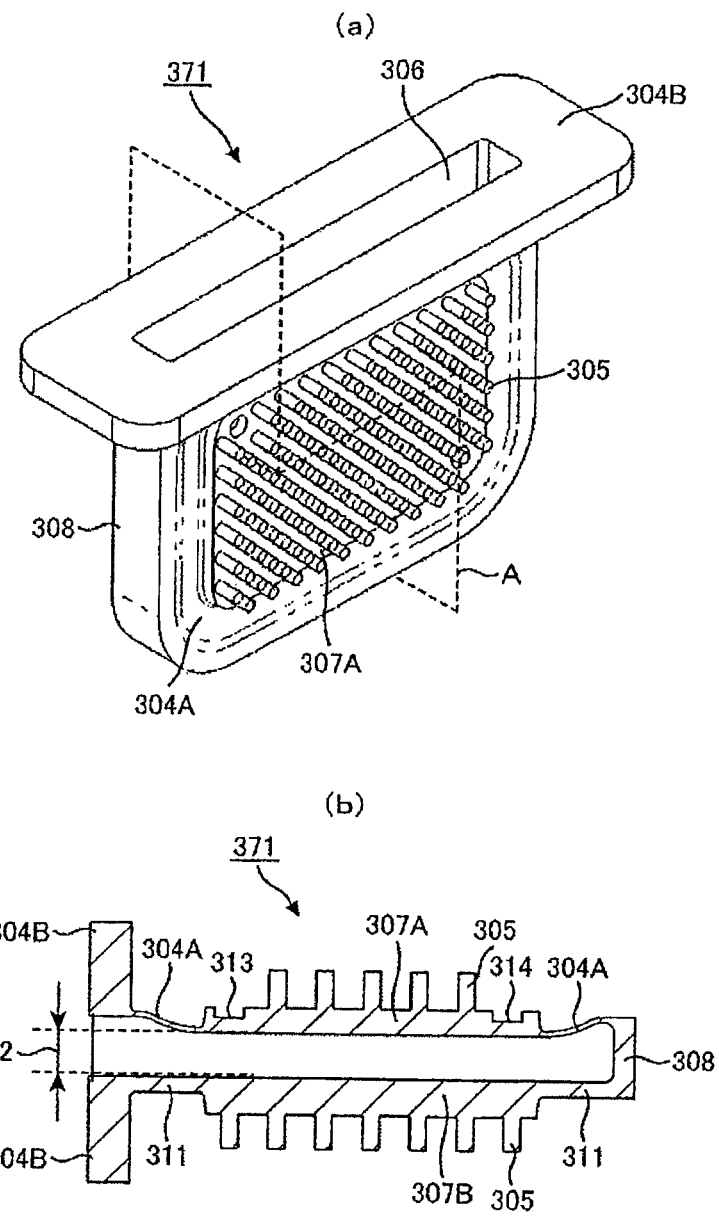
FIG. 22(a) is a perspective view of a module case 371 according to a third embodiment.
FIG. 22(b) is a sectional view of the module case 371 viewed from a cross section A of FIG. 22(a)

FIG. 22(a) is a perspective view of a module case 371 according to a third embodiment. FIG. 22(b) is a sectional view of the module case 371 viewed from a cross section A of FIG. 22(a). FIGS. 23(a) to 23(d) are process charts showing a process for inserting the module primary sealing body 302 into the module case 371. Components denoted by reference numerals and signs same as those in the embodiment explained above (FIG. 20) have functions same as those of the components in the embodiment.

Figure 23:
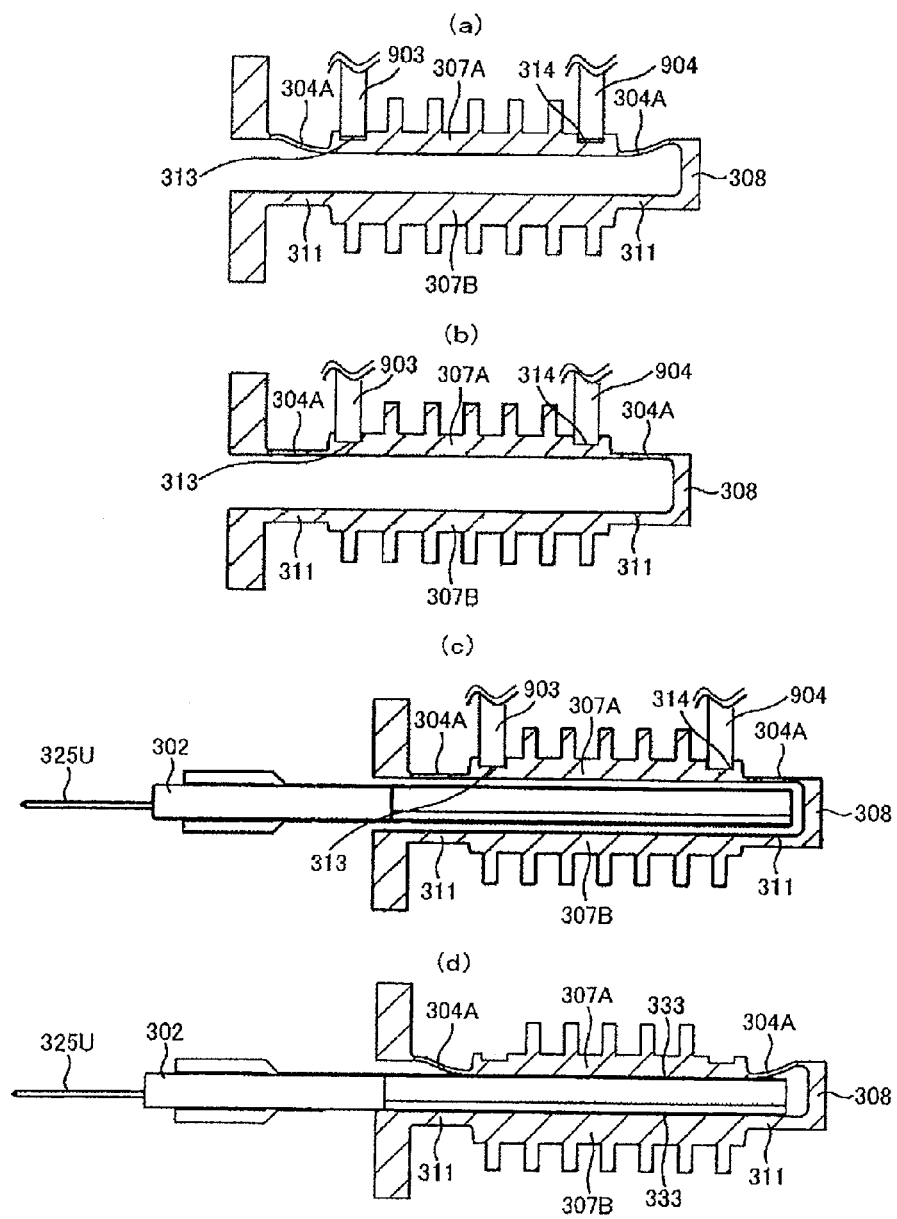
FIG. 23 is a process chart showing a process for inserting the module primary sealing body 302 into the module case 371.

Concave sections 313 and 314 are formed in the first radiator 307A surrounded by the thin section 304A. As shown in FIG. 23(a), jigs 903 and 904 are inserted into these concave sections 313 and 314. The jigs 903 and 904 generate an upward tensile force for elastically deforming the thin section 304A and lifting the first radiator 307A. As shown in FIGS. 23(b) to 23(d), a process for inserting the module primary sealing body 302 and supporting and fixing the module primary sealing body 302 in the module case 371 is performed.

This leads to improvement of productivity and a reduction in costs because the jigs 900 and 902 used in the first and second embodiments are unnecessary. In the first and second embodiments, it is necessary to provide a space in a jig inserting portion when the jig is inserted into the case in expanding the case. However, in this embodiment, the concave sections 313 and 314 are provided on the outer surface side of the module case 371. Consequently, it is possible to reduce the size of the module case 371 because it is unnecessary to provide a space for inserting the jigs 900 and 902 on the inside of the module case 371.

The concave section 314 is formed diagonally from the concave section 313 in the first radiator 307A. Consequently, force for pulling the first radiator 307A is transmitted in a well-balanced state. It is possible to increase parallelism of the module case 371 and the module primary sealing body 302.

In this embodiment, the thin section 304A is formed only in the first radiator 307A. However, this embodiment can also be applied when the thin section 304A is formed in both the first radiator 307A and the second radiator 307B. In other words, the concave sections 313 and 314 are formed in both the first radiator 307A and the second radiator 307B.

Figure 24:
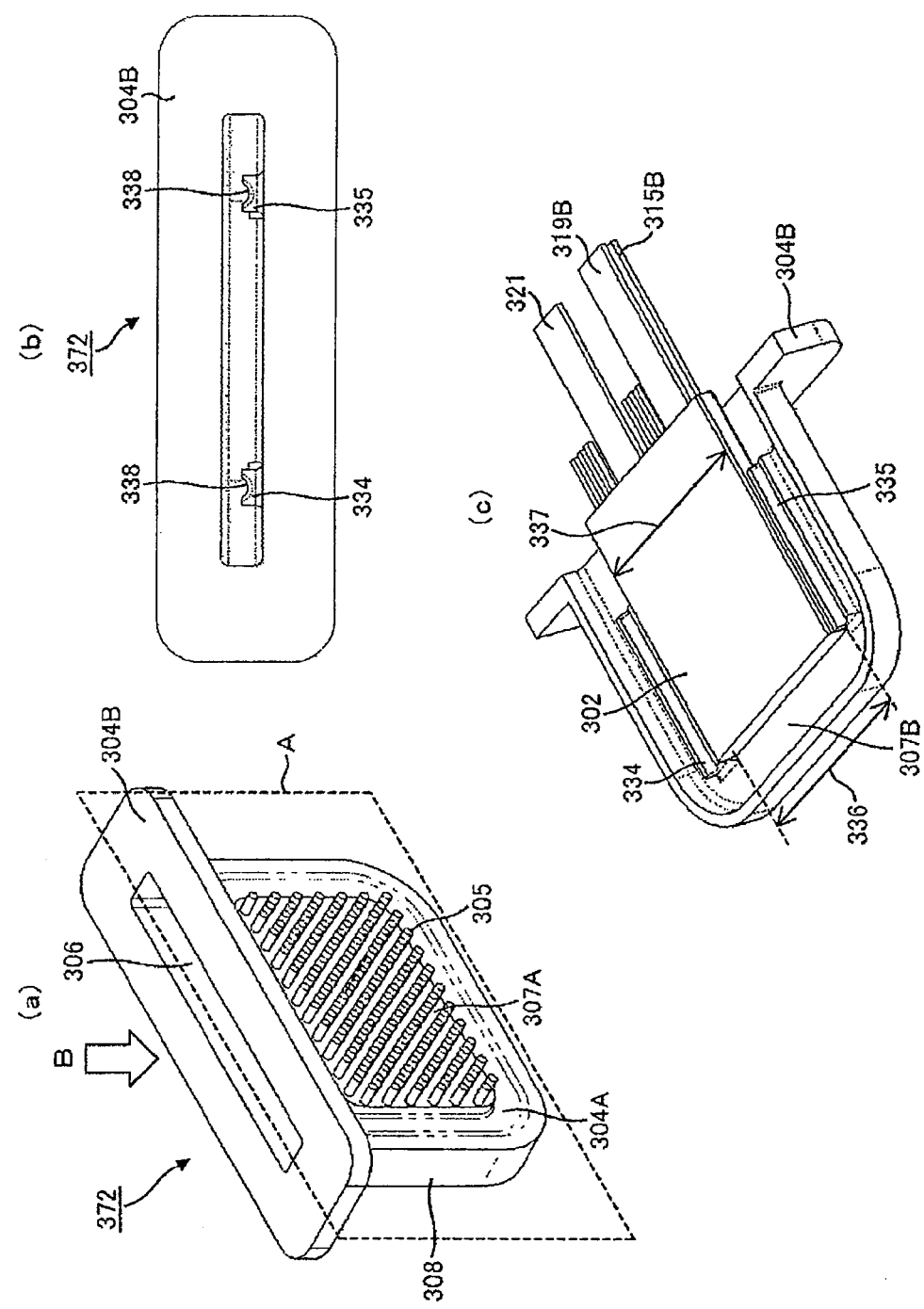
FIG. 24(a) is a perspective view of a module case 372 according to a fourth embodiment.
FIG. 24(b) is a diagram showing the inside of the module case 372 viewed from an arrow B direction.
FIG. 24(c) is a sectional view of the module case 371 viewed from the cross section A of FIG. 24(a)

FIG. 24(a) is a perspective view of a module case 372 according to a fourth embodiment. FIG. 24(b) is a diagram showing the inside of the module case 372 viewed from an arrow B direction. FIG. 24(c) is a sectional view of the module case 372 viewed from a cross section A of FIG. 24(a).

The structures of the module cases according to the second and third embodiments are effective for positioning in the thickness direction. However, in a connecting position of the module sealing body 302 and the driver circuit substrate 22, positioning in the thickness direction of the module sealing body 302 and a direction perpendicular to the thickness direction needs to be performed.

Therefore, as shown in FIG. 24(c), a first protruding section 334 and a second protruding section 335 are formed on the inner wall of the module case 372. For example, the first protruding section 334 and the second protruding section 335 are formed on the inner wall side of the module case 372 of the second radiator 307B. The first protruding section 334 and the second protruding section 335 are formed such that a distance 336 between the first protruding section 334 and the second protruding section 335 is substantially the same as width 337 of the module sealing body 302. The distance 336 and the width 337 being substantially the same means size for enabling the module sealing body 302 to be inserted into the first protruding section 334 and the second protruding section 335 and slide. Consequently, it is possible to improve accuracy of the positioning of the module sealing body 302, leading to improvement of productivity.

Grooves 338 are formed at ends of the first protruding section 334 and the second protruding section 335. The grooves 338 have a function of positioning a jig for pushing the second radiator 307B upward. Consequently, further improvement of productivity can be expected.

Figure 25:
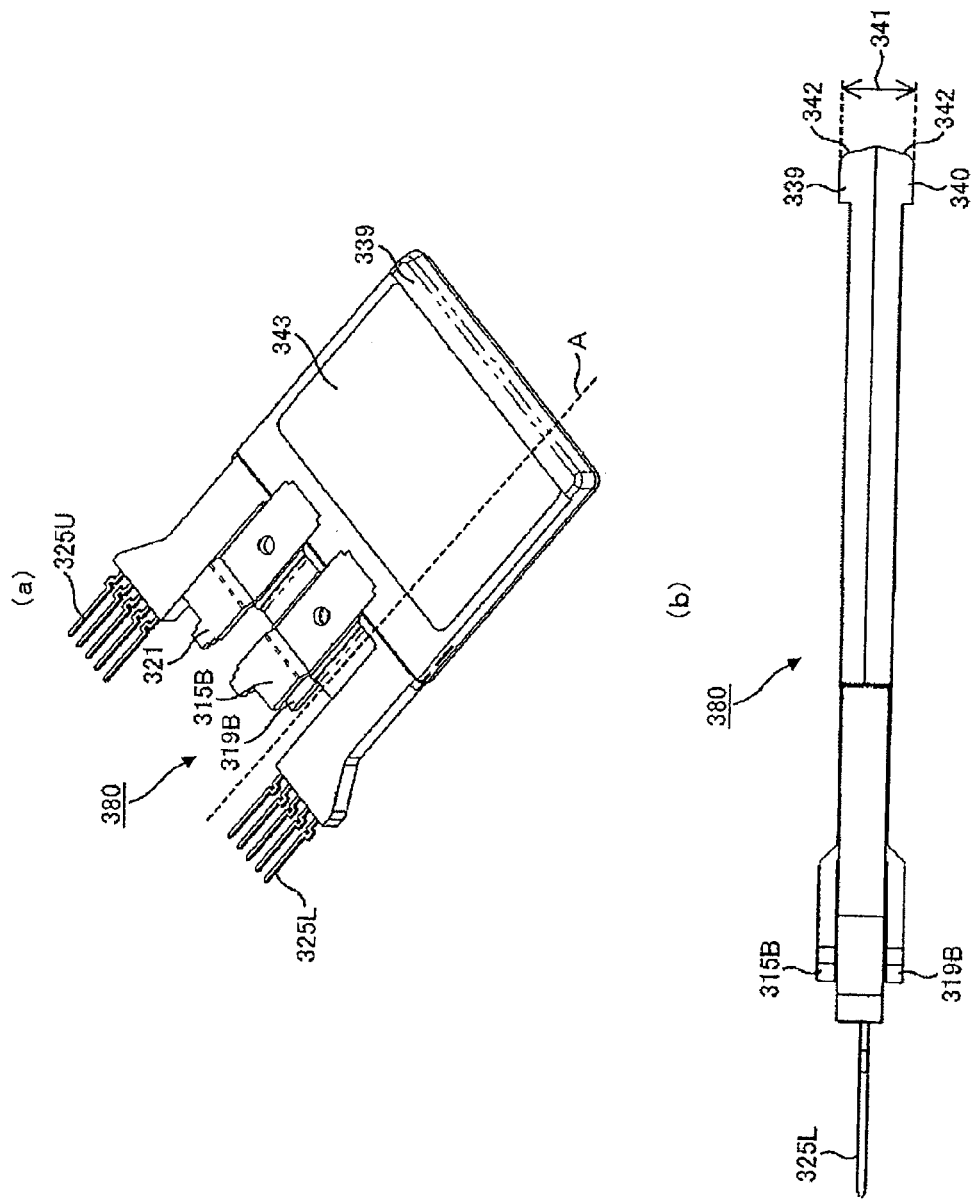
FIG. 25(a) is a perspective view of a module primary sealing body 380 according to a fifth embodiment.
FIG. 25(b) is a sectional view of the module primary sealing body 380 taken along a line A shown in FIG. 25(a)
Figure 26:
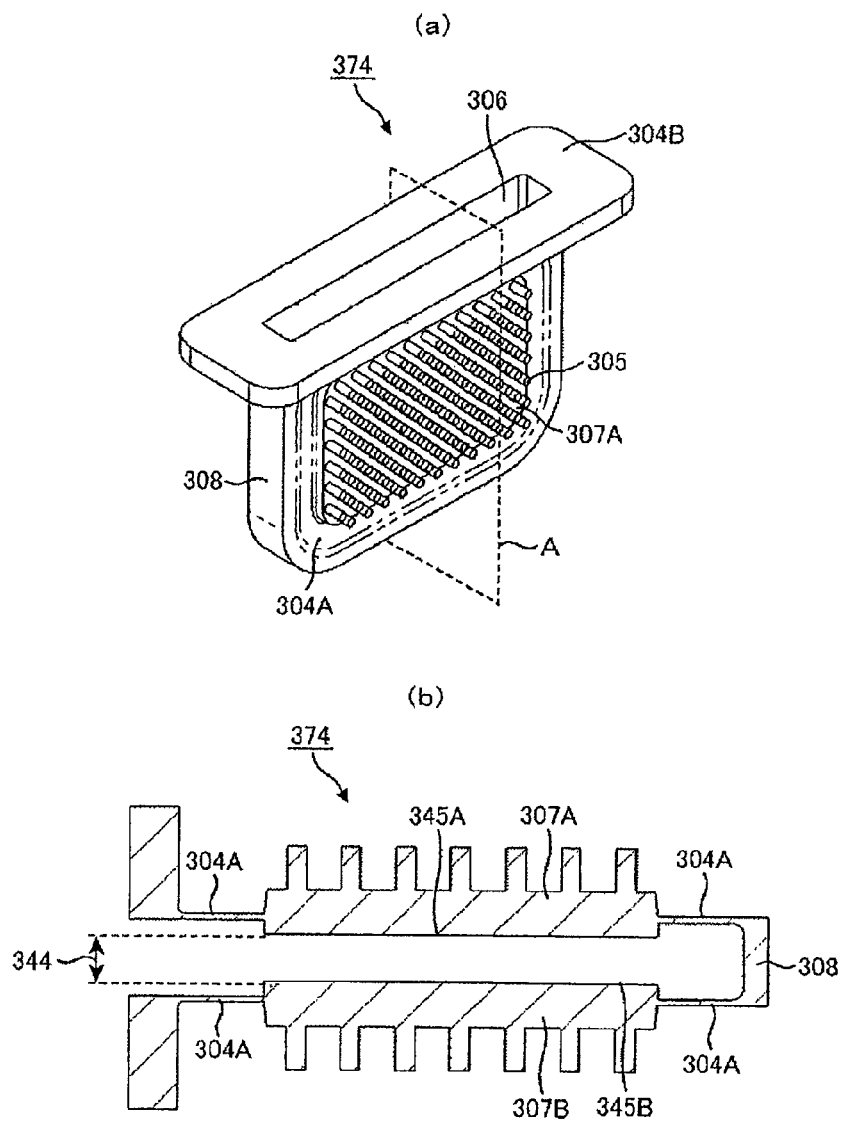
FIG. 26(a) is a perspective view of a module case 374 according to the fifth embodiment.
FIG. 26(b) is a sectional view of a module case 373 viewed from a cross section A of FIG. 26(a)

FIG. 25(a) is a perspective view of a module primary sealing body 380 according to a fifth embodiment. FIG. 25(b) is a sectional view of the module primary sealing body 380 taken along on a broken line A shown in FIG. 25a). FIG. 26(a) is a perspective view of a module case 374 according to the fifth embodiment. FIG. 26(b) is a sectional view of the module case 373 viewed from a cross section A of FIG. 26(a). Components denoted by reference numerals and signs same as those in the embodiment explained above (FIG. 8(b)) have functions same as those of the components in the embodiment.

In the module primary sealing body 380, a first projecting section 339 and a second projecting section 340 are provided on an end side on the opposite side of a side where the alternating-current terminal 321 projects. The first projecting section 339 and the second projecting section 340 form a part of the first sealing resin 348. Corners 342 of the first projecting section 339 and the second projecting section 340 are formed in a shape having smooth R. Consequently, when the module primary sealing body 380 comes into contact with the module case 374 explained below, the corners 342 of the first projecting section 339 and the second projecting section 340 are less easily chipped. Consequently, heat conduction of a heat radiation surface 343 of the module primary sealing body 380 is prevented from being deteriorated. The first projecting section 339 and the second projecting section 340 are formed such that a distance 341 between the top of the first projecting section 339 and the top of the second projecting section 340 is larger than an inter-inner wall distance 344 shown in FIG. 26(b).

As shown in FIG. 26(b), a first projecting surface 345A is formed on the inner wall side of the module case 374. Further, a second projecting surface 345B is formed on the inner wall side of the module case 374 and spaced apart from the first projecting surface 345A. The first projecting surface 345A is formed integrally with the first radiator 307A and the second projecting surface 345B is formed integrally with the second radiator 307B. Therefore, high thermal conductivity is maintained.

Figure 27:
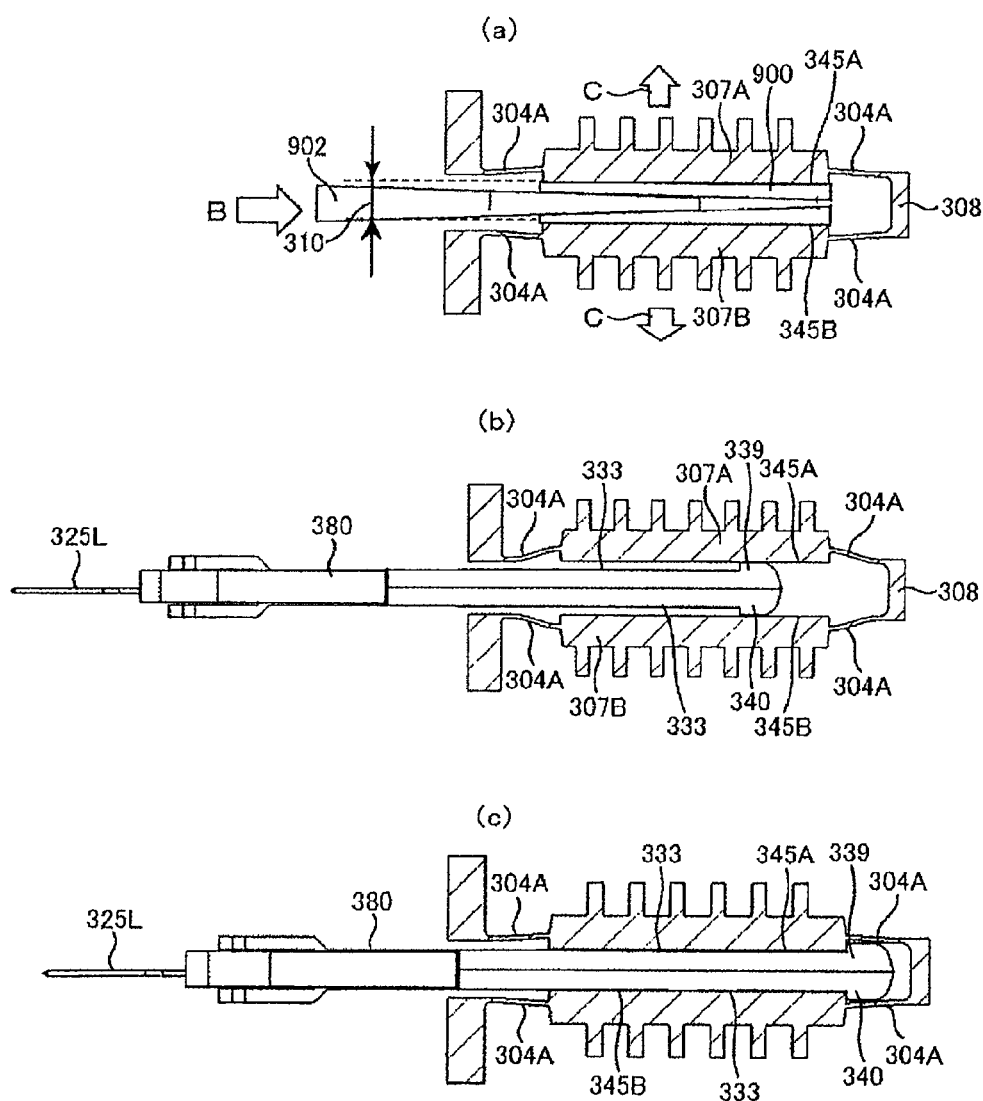
FIG. 27 is a process chart showing a process for inserting the module primary sealing body 380 into the module case 374.

FIGS. 27(a) to 27(c) are process charts showing a process for inserting the module primary sealing body 380 into the module case 374.

As shown in FIG. 27(a), the jig 902 is inserted into the space 901 of the jig 900 and the jig 902 is pressurized in the pressurizing direction B, whereby the jig 900 is deformed in the transitioning direction C and the module case 374 is expanded by the jig 900. Pressurizing force of the jig 902 is set such that the inter-inner wall distance 310 after the expansion of the module case 374 is larger than the distance 341 between the top of the first projecting section 339 and the top of the second projecting section 340.

Subsequently, as shown in FIG. 27(b), the module primary sealing body 380 is inserted into the module case 374. The insulating sheets 333 are respectively arranged on both surfaces of the module primary sealing body 380. The first projecting section 339 and the second projecting section 340 respectively come into contact with the first projecting surface 345A and the second projecting surface 345B. Consequently, it is possible to prevent the module case 374 from coming into contact with the insulating sheets 333 to deviate the positions of the insulating sheets 333.

As shown in FIG. 27(c), the jig 900 and the jig 902 are removed from the module case 374. The pressurizing force for elastically deforming the thin section 304A is released. When the pressurizing force is released, elastic force to return to the inter-inner wall distance 344 of the module case 304 acts on the elastically-deformed thin section 304A. The module primary sealing body 380 is supported and fixed by the first radiator 307A and the second radiator 307B.

In this embodiment, a step of using the jigs 900 and 902 as shown in FIG. 27(a) is explained. However, this step can be omitted. Specifically, the first projecting section 339 and the second projecting section 340 are formed to taper as shown in FIG. 25(b). The first projecting section 339 and the second projecting section 340 are respectively brought into contact with the first projecting surface 345A and the second projecting surface 345B and the module primary sealing body 380 itself is pressed in a direction in which the module primary sealing body 380 is inserted into the module case 374, whereby the first radiator 307A and the second radiator 307B can be pushed up. This makes it unnecessary to use the jigs 900 and 902 and productivity is improved, leading to a reduction in costs.

In the module case 374 in this embodiment, the thin section 304A surrounding the second radiator 307B may be the fixed member 311 explained in the second embodiment. In that case, it is possible to attain the object only with the first projecting section 339 without providing the second projecting section 340.

Figure 28:
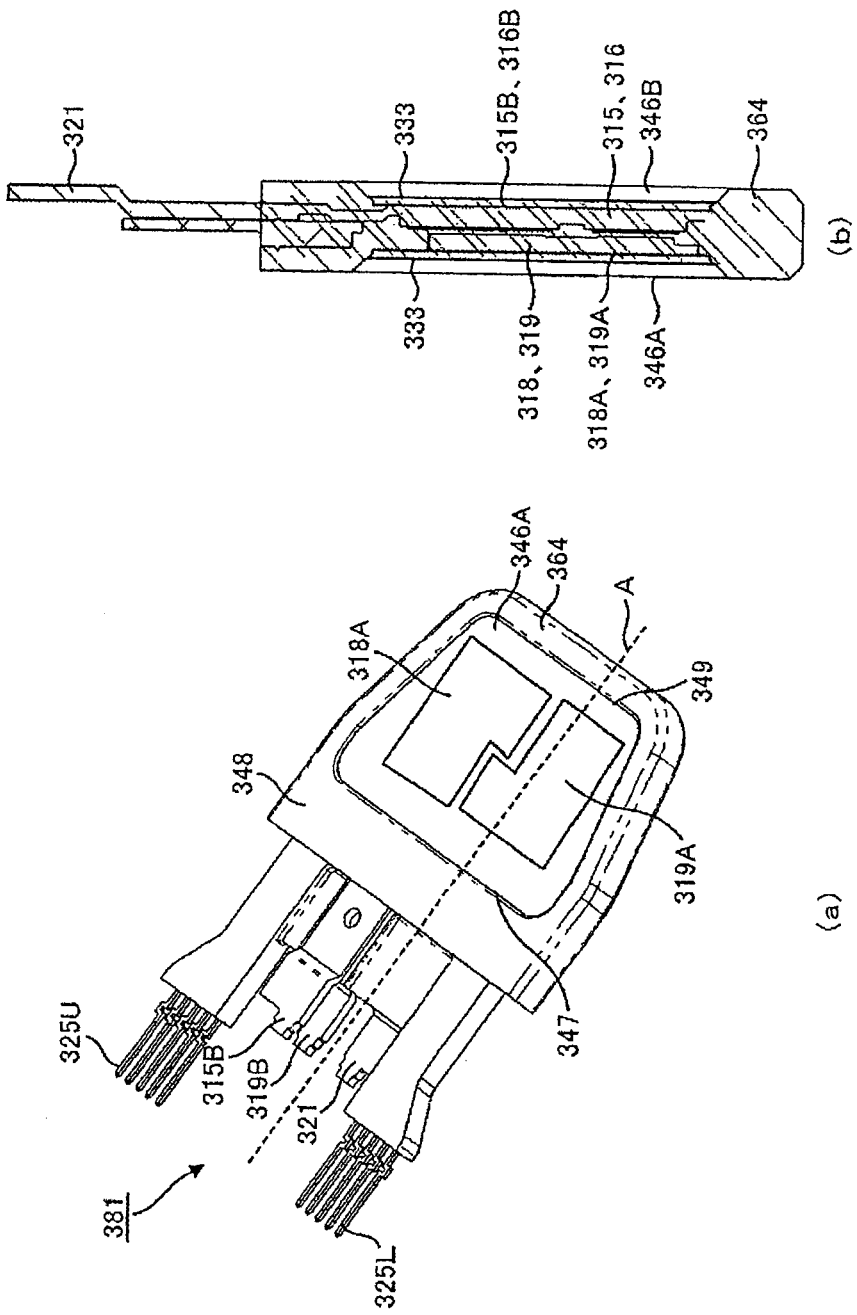
FIG. 28(a) is a perspective view of a module primary sealing body 381 according to a sixth embodiment.
FIG. 28(b) is a sectional view of the module primary sealing body 381 taken along a line A shown in FIG. 28(a)
Figure 29:
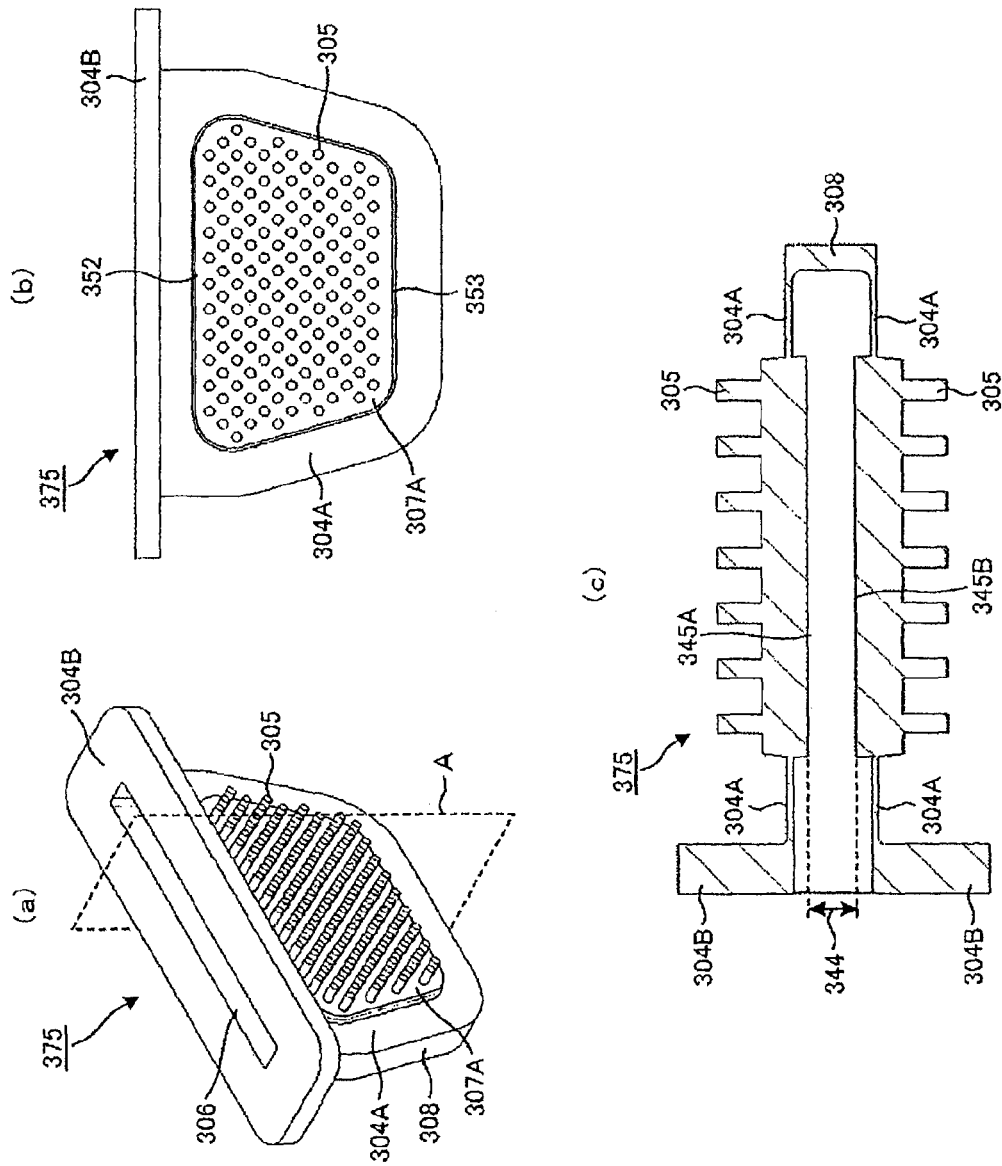
FIG. 29(a) is a perspective view of a module case 375 according to the sixth embodiment.
FIG. 29(b) is a front view of the module case 375 viewed from a formation surface of fins 305.
FIG. 29(c) is a sectional view of the module case 375 viewed from a cross section A of FIG. 29(a)

FIG. 28(a) is a perspective view of a module primary sealing body 381 according to a sixth embodiment. FIG. 28(b) is a sectional view of the module primary sealing body 381 taken along a broken line A shown in FIG. 28(a). FIG. 29(a) is a perspective view of a module case 375 according to the sixth embodiment. FIG. 29(b) is a front view of the module case 375 viewed from a formation surface of the fins 305. FIG. 29(c) is a sectional view of the module case 375 viewed from a cross section A of FIG. 29(a). Components denoted by reference numerals and signs same as those in the embodiment explained above (FIGS. 25 and 26) have functions same as those of the components in the embodiment.

As shown in FIGS. 28(a) and 28(b), in the module primary sealing body 381, a first concave section 346A is formed on one surface and a second concave section 346B is formed on the other surface. The first concave section 346A and the second concave section 346B are formed by heaping up the first sealing resin 348 on the end side of the module primary sealing body 381. A portion where the first sealing resin 348 is heaped up is a convex section 364. The convex section 364 is formed to be gentle at corners to prevent the corners from being shaved. In the bottom of the first concave section 346A, an exposed surface 318A of the conductor plate 318 and an exposed surface 319A of the conductor plate 319 are exposed. On the other hand, as shown in FIG. 28(b), in the bottom of the second concave section 346B, an exposed surface 315B of the conductor plate 315 and an exposed surface 316B of the conductor plate 316 are exposed.

As shown in FIG. 28(a), when projected from a direction perpendicular to the exposed surface 318A of the conductor plate 318, the first concave section 346A is formed such that the length of a first side 347 is larger than the length of a second side 349. The first side 347 is a side on a side close to the alternating-current terminal 321 in a projected portion of the first concave section 346A. The second side 349 is a side opposed to the first side 347. In other words, the projected portion of the first concave section 346A is formed in a trapezoidal shape shown in FIG. 28(a). The second concave section 346 is formed in the same configuration.

As shown in FIG. 28(b), the exposed surface 315B and the exposed surface 316B are covered with one insulating sheet 333. The exposed surface 318A and the exposed surface 319A are covered with one insulating sheet 333. The insulating sheet 333 is formed in a shape to be stored in the bottom of the first concave section 346A or the bottom of the second concave section 346B. For example, exposed sections of the conductor plates are covered to be formed in a trapezoidal shape to have the same shape as the first concave section 346A and the second concave section 346B. Therefore, it is possible to prevent an air gap that causes arc discharge from being provided in the module case 375.

As shown in FIGS. 29(a) and 29(b), the module case 375 in this embodiment is formed such that the length of a side on a side close to the insertion port 306 is larger than the length of a side on which the bottom surface of the module case 375 is formed. As shown in FIG. 29(b), when viewed from the formation surface side of the fins 305, the first radiator 307A and the second radiator 307B are formed in a shape same as the shape of the first concave section 346A and the second concave section 346B of the module primary sealing body 381. In other words, the first radiator 307A is formed such that a first side 352 on a side close to the flange 304B is longer than a second side 353 on a side close to the bottom surface of the module case 375. The second radiator 307B is formed in the same shape. As shown in FIG. 29(c), the module case 375 is configured such that the inter-inner wall distance 344 is smaller than the height of the convex section 364 shown in FIG. 28(b).

Figure 30:
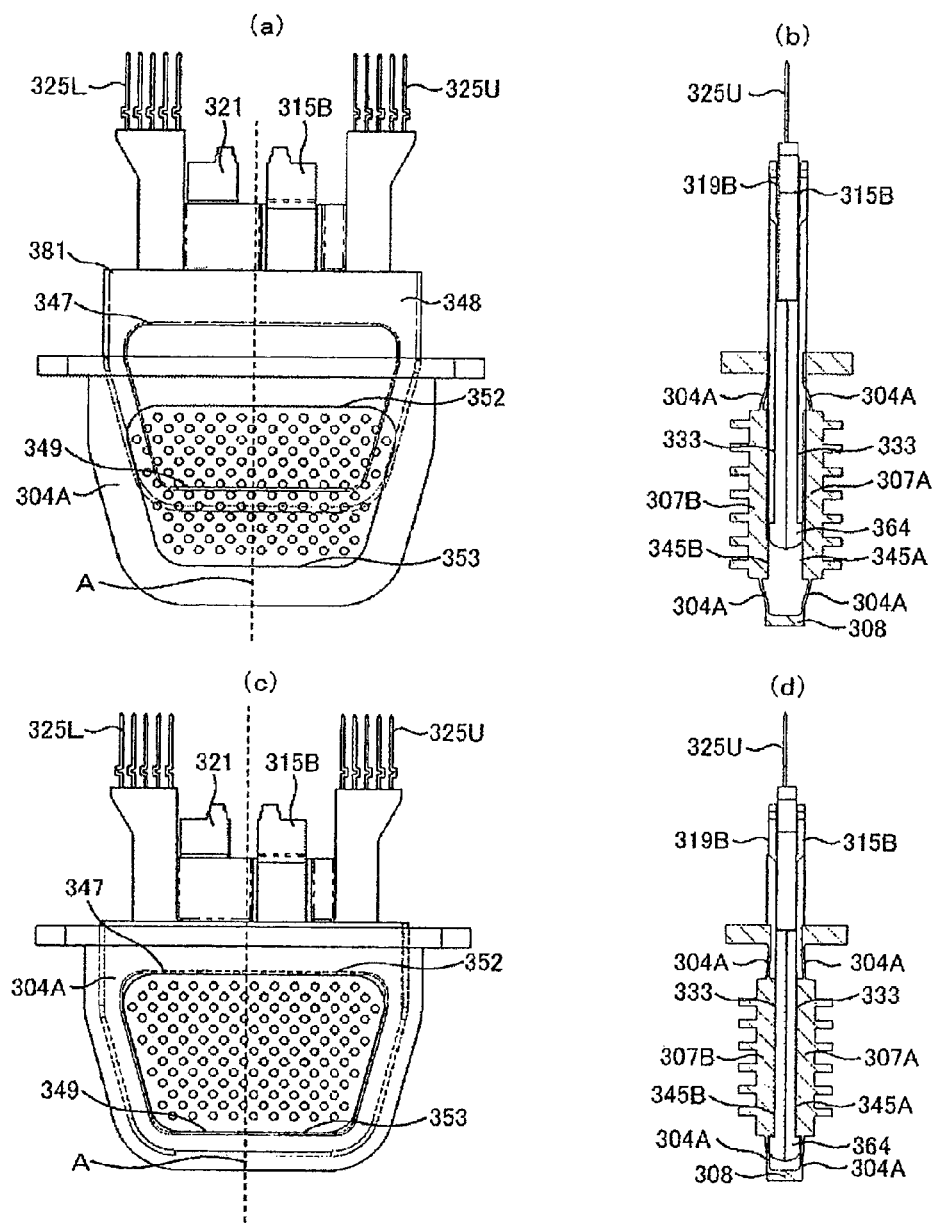
FIG. 30 is a process chart showing a process for inserting the module primary sealing body 381 into the module case 375.

FIGS. 30(a) to 30(d) are process charts showing a process for inserting the module primary sealing body 381 into the module case 375. FIG. 30(b) is a sectional view taken along a broken line A shown in FIG. 30(a). FIG. 30(d) is a sectional view taken along a broken line A shown in FIG. 30(c).

As shown in FIGS. 30(a) and 30(b), the module primary sealing body 381 is inserted into the module case 375, whereby the first radiator 307A and the second radiator 307B are pushed apart by the convex section 364. The distance between the first radiator 307A and the second radiator 307B is substantially the same as the height of the convex section 364. The insulating sheets 333 are respectively arranged on both surfaces of the module primary sealing body 381. The convex section 364 comes into contact with the first projecting surface 345A and the second projecting surface 345B. Consequently, it is possible to prevent the module case 375 from coming into contact with the insulating sheets 333 to deviate the positions of the insulating sheets 333.

As shown in FIGS. 30(a) and 30(b), the second side 353 of the convex section 364 is inserted into the module case 375 in a state in which the second side 353 is in contact with the first side 352 of the first radiator 307A. Consequently, the first radiator 307A is lifted in parallel to the module primary sealing body 381. Therefore, it is possible to prevent the first projecting surface 345A of the module case 375 from coming into contact with the first concave section 346A of the module primary sealing body 381 while the module primary sealing body 381 is inserted into the module case 375. Further, it is possible to prevent the thin section 304A surrounding the first radiator 307A from being locally deformed to concentrate stress and cause breakage such as a crack of the thin section 304A. Concerning the second radiator 307B, the same configuration and the same action and effects are realized.

As shown in FIGS. 30(c) and 30(d), the first projecting surface 345A of the module case 375 is fitted in the first concave section 346A of the module primary sealing body 381. The distance between the first projecting surface 345A and the second projecting surface 345B shown in FIGS. 30(c) and 30(d) is substantially the same as the distance between the bottom surface of the first concave section 346A and the bottom surface of the second concave section 346B. Consequently, the first projecting surface 345A and the first concave section 346A set close to and thermally connected to each other to improve heat radiation properties of the semiconductor elements.

It is possible to reduce jigs for manufacturing and improve productivity by using the power modules in this embodiment. Further, it is possible to improve positioning accuracy for the terminals such as the signal terminals 325U.

The fins 305 of the module cases 370 to 375 according to the first to sixth embodiments explained above are formed in a pin shape. However, straight type fines can also be used as the fins 305. The rigidity of the first radiator 307A and the second radiator 307B is increased by using the straight type fins. Consequently, it is possible to improve reliability of a manufacturing process in pushing apart the first radiator 307A and the second radiator 307B and inserting the module primary sealing body as in the embodiments.

The various embodiments and modifications are explained above. However, the present invention is not limited to the contents of the embodiments and the modifications. Other forms conceivable within the scope of the technical idea of the present invention are also included in the scope of the present invention.

The disclosed contents of the following priority base application are incorporated herein as reference.

Japanese Patent Application No. 2010-100468 (filed on Apr. 26, 2010)

The invention claimed is:

1. A power module comprising:
a sealing body including a semiconductor element having a plurality of electrode surfaces, a first conductor plate connected to one electrode surface of the semiconductor element via solder, and a sealing material for sealing the semiconductor element and the first conductor plate, the sealing body having at least a first surface and a second surface on an opposite side of the first surface; and
a case for housing the sealing body, wherein
the case is configured by a first heat radiation plate opposed to the first surface of the sealing body, a second heat radiation plate opposed to the second surface of the sealing body, and an intermediate member that connects the first heat radiation plate and the second heat radiation plate,
the intermediate member has a first thin section having thickness smaller than thickness of the first heat radiation plate, more easily elastically deformed than the first heat radiation plate, and formed to surround the first heat radiation plate, and
the sealing body is pressed against and fixed to the second heat radiation plate via the first heat radiation plate by elastic force generated in the first thin section.

2. The power module according to claim 1, wherein a surface of the first heat radiation plate opposed to the first surface of the sealing body is formed to be flush with a surface of the first thin section on an inner side of the case.

3. The power module according to claim 1, wherein pin fins are formed on the first heat radiation plate and the second heat radiation plate.

4. The power module according to claim 1, wherein linear fins are formed on the first heat radiation plate and the second heat radiation plate.

5. The power module according to claim 1, wherein
the intermediate member has a second thin section having thickness smaller than thickness of the second heat radiation plate, more easily elastically deformed than the second heat radiation plate, and formed to surround the second heat radiation plate, and
the sealing body is pressed against the second heat radiation plate via the first heat radiation plate by elastic force generated in the first thin section and pressed against and fixed to the second heat radiation plate via the second heat radiation plate by elastic force generated in the second thin section.

6. The power module according to claim 1, wherein a holding section is formed in the intermediate member, the holding section having thickness larger than thickness of the first thin section, formed to surround the second heat radiation plate, and having rigidity for preventing the holding section from being deformed even if the holding section receives elastic force of the first thin section generated via the first heat radiation plate and the sealing body.

7. The power module according to claim 6, wherein a first protruding section set in contact with a side of the sealing body is formed on an inner wall of the case on a side where the second heat radiation plate is arranged.

8. The power module according to claim 1, wherein
the sealing body includes a second conductor plate connected to the other electrode surface of the semiconductor element via solder,
a first concave section in which the first conductor plate is exposed in a bottom is formed on the first surface of the sealing body and a second concave section in which the second conductor plate is exposed in a bottom is formed on the second surface of the sealing body, and
the first heat radiation plate is fitted in the first concave section, and the second heat radiation plate is fitted in the second concave section.

9. The power module according to claim 8, further comprising:
a first insulating sheet opposed to an exposed surface of the first conductor plate and stored in the first concave section; and
a second insulating sheet opposed to an exposed surface of the second conductor plate and stored in the second concave section.

10. The power module according to claim 8, wherein
an opening section for inserting the sealing body is formed in the case, and
when projected from a direction perpendicular to the electrode surfaces of the semiconductor element, the first concave section is formed such that length of a first side of a projected portion of the first concave section on a side close to the opening section of the case is larger than length of the second side opposed to the first side, and the first heat radiation plate is formed such that a projected portion of the first heat radiation plate overlaps a projected section of the first concave section.

11. The power module according to claim 10, wherein
the first heat radiation plate is formed such that length of a first side of the projected portion of the first heat radiation plate on a side close to the opening section of the case is larger than length of a second side opposed to the first side.

12. A manufacturing method for a power module including:
a sealing body including a semiconductor element, a conductor plate connected to an electrode surface of the semiconductor element via solder, and a sealing material for sealing the semiconductor element and the conductor plate, the sealing body having at least a first surface and a second surface on the opposite side of the first surface; and
a case including a first heat radiation plate opposed to the first surface of the sealing body, a second heat radiation plate opposed to the second surface of the sealing body, and an intermediate member that connects the first heat radiation plate and the second heat radiation plate and in which an opening for inserting the sealing body is formed,
the manufacturing method comprising:
a first step of elastically deforming, when a distance between an opposed surface of the first heat radiation plate and an opposed surface of the second heat radiation plate is defined as D and thickness of the sealing body is defined as T, a part of the intermediate member of the case such that, in the case formed to have the D smaller than the T, the D changes to D1 larger than the T;
a second step of inserting the sealing body from the opening of the case; and
a third step of releasing pressurizing force for elastically deforming the part of the intermediate member in the first step such that the D approaches the T from the D1.

13. A manufacturing method for a power module including:
a sealing body including a semiconductor element, a conductor plate connected to an electrode surface of the semiconductor element via solder, and a sealing material for sealing the semiconductor element and the conductor plate, the sealing body having a first concave section formed on one surface and a second concave section formed on the other surface on the opposite side of the one surface, the sealing body having at least a first surface and a second surface on the opposite side of the first surface; and
a case including a first heat radiation plate opposed to the first surface of the sealing body and fit in the first concave section, a second heat radiation plate opposed to the second surface of the sealing body and fit in the second concave section, and an intermediate member that connects the first heat radiation plate and the second heat radiation plate and in which an opening for inserting the sealing body is formed,
the manufacturing method comprising:
a first step of elastically deforming, when a distance between an opposed surface of the first heat radiation plate and an opposed surface of the second heat radiation plate is defined as D, a distance between a bottom of the first concave section and a bottom of the second concave section of the sealing body is defined as T1, and thickness of the sealing body is defined as T2, a part of the intermediate member of the case with pressing force of the sealing body inserted from the opening of the case such that, in the case formed to have the D smaller than the T1, the D changes to D1 larger than the T2; and
a second step of fitting the first heat radiation plate in the first concave section of the sealing body and fitting the second heat radiation plate in the second concave section of the sealing body.

* * * * *